United States Patent
Haba et al.

(10) Patent No.: US 8,310,036 B2
(45) Date of Patent: Nov. 13, 2012

(54) CHIPS HAVING REAR CONTACTS CONNECTED BY THROUGH VIAS TO FRONT CONTACTS

(75) Inventors: Belgacem Haba, Saratoga, CA (US); Kenneth Allen Honer, Santa Clara, CA (US); David B. Tuckerman, Lafayette, CA (US); Vage Oganesian, Palo Alto, CA (US)

(73) Assignee: DigitalOptics Corporation Europe Limited (IE)

( * ) Notice: Subject to any disclaimer, the term of this patent is extended or adjusted under 35 U.S.C. 154(b) by 50 days.

(21) Appl. No.: 12/784,841

(22) Filed: May 21, 2010

(65) Prior Publication Data

US 2010/0225006 A1    Sep. 9, 2010

Related U.S. Application Data

(66) Division of application No. 12/072,508, filed on Feb. 26, 2008, Substitute for application No. 60/905,096, filed on Mar. 5, 2007.

(51) Int. Cl.
*H01L 21/00* (2006.01)

(52) U.S. Cl. ........ 257/678; 257/690; 257/704; 257/774; 257/E21.499; 257/E21.598; 257/E23.011; 257/E23.114; 257/E23.169; 257/E25.013

(58) Field of Classification Search .......... 257/621, 257/678, 690, 693, 704, 774, E21.502, 577, 257/598, 23.01, 11, 114, 168, 169, 25.013
See application file for complete search history.

(56) References Cited

U.S. PATENT DOCUMENTS

| | | |
|---|---|---|
| 4,682,074 A | 7/1987 | Hoeberechts et al. |
| 4,765,864 A | 8/1988 | Holland et al. |
| 5,322,816 A | 6/1994 | Pinter |
| 5,481,133 A | 1/1996 | Hsu |
| 5,686,762 A | 11/1997 | Langley |
| 5,700,735 A | 12/1997 | Shiue et al. |
| 5,703,408 A | 12/1997 | Ming-Tsung et al. |
| 5,808,874 A | 9/1998 | Smith |
| 6,005,466 A | 12/1999 | Pedder |
| 6,013,948 A | 1/2000 | Akram et al. |
| 6,022,758 A | 2/2000 | Badehi |
| 6,031,274 A | 2/2000 | Muramatsu et al. |

(Continued)

FOREIGN PATENT DOCUMENTS

EP    0316799 A1    5/1989

(Continued)

OTHER PUBLICATIONS

U.S. Appl. No. 12/143,743, "Recontituted Wafer Level Stacking", filed Jun. 20, 2008.

(Continued)

*Primary Examiner* — Michael Lebentritt
(74) *Attorney, Agent, or Firm* — Lerner, David, Littenberg, Krumholz & Mentlik, LLP

(57) ABSTRACT

A microelectronic unit is provided in which front and rear surfaces of a semiconductor element may define a thin region which has a first thickness and a thicker region having a thickness at least about twice the first thickness. A semiconductor device may be present at the front surface, with a plurality of first conductive contacts at the front surface connected to the device. A plurality of conductive vias may extend from the rear surface through the thin region of the semiconductor element to the first conductive contacts. A plurality of second conductive contacts can be exposed at an exterior of the semiconductor element. A plurality of conductive traces may connect the second conductive contacts to the conductive vias.

25 Claims, 25 Drawing Sheets

U.S. PATENT DOCUMENTS

| | | |
|---|---|---|
| 6,103,552 A | 8/2000 | Lin |
| 6,143,396 A | 11/2000 | Saran et al. |
| 6,169,319 B1 | 1/2001 | Malinovich et al. |
| 6,181,016 B1 | 1/2001 | Lin et al. |
| 6,261,865 B1 | 7/2001 | Akram |
| 6,277,669 B1 | 8/2001 | Kung et al. |
| 6,284,563 B1 | 9/2001 | Fjelstad |
| 6,313,540 B1 | 11/2001 | Kida et al. |
| 6,368,410 B1 | 4/2002 | Gorczyca et al. |
| 6,472,247 B1 | 10/2002 | Andoh et al. |
| 6,492,201 B1 | 12/2002 | Haba |
| 6,498,387 B1 | 12/2002 | Yang |
| 6,586,955 B2 | 7/2003 | Fjelstad et al. |
| 6,608,377 B2 | 8/2003 | Chang et al. |
| 6,693,358 B2 | 2/2004 | Yamada et al. |
| 6,727,576 B2 | 4/2004 | Hedler et al. |
| 6,737,300 B2 | 5/2004 | Ding et al. |
| 6,743,660 B2 | 6/2004 | Lee et al. |
| 6,812,549 B2 | 11/2004 | Umetsu et al. |
| 6,828,175 B2 | 12/2004 | Wood et al. |
| 6,864,172 B2 | 3/2005 | Noma et al. |
| 6,867,123 B2 | 3/2005 | Katagiri et al. |
| 6,879,049 B1 | 4/2005 | Yamamoto et al. |
| 6,982,475 B1 | 1/2006 | MacIntyre |
| 7,068,139 B2 | 6/2006 | Harris et al. |
| 7,091,062 B2 | 8/2006 | Geyer |
| 7,271,033 B2 | 9/2007 | Lin et al. |
| 7,329,563 B2 | 2/2008 | Lo et al. |
| 7,413,929 B2 | 8/2008 | Lee et al. |
| 7,420,257 B2 | 9/2008 | Shibayama |
| 7,436,069 B2 | 10/2008 | Matsui |
| 7,446,036 B1 | 11/2008 | Bolom et al. |
| 7,456,479 B2 | 11/2008 | Lan |
| 7,531,445 B2 | 5/2009 | Shiv |
| 7,531,453 B2 | 5/2009 | Kirby et al. |
| 7,719,121 B2 | 5/2010 | Humpston et al. |
| 7,750,487 B2 | 7/2010 | Muthukumar et al. |
| 7,754,531 B2 | 7/2010 | Tay et al. |
| 7,767,497 B2 | 8/2010 | Haba |
| 7,781,781 B2 | 8/2010 | Adkisson et al. |
| 7,791,199 B2 | 9/2010 | Grinman et al. |
| 7,935,568 B2 * | 5/2011 | Oganesian et al. ........... 438/106 |
| 8,008,192 B2 | 8/2011 | Sulfridge |
| 2001/0048591 A1 | 12/2001 | Fjelstad et al. |
| 2002/0061723 A1 | 5/2002 | Duescher |
| 2002/0096787 A1 | 7/2002 | Fjelstad |
| 2002/0109236 A1 | 8/2002 | Kim et al. |
| 2003/0059976 A1 | 3/2003 | Nathan et al. |
| 2003/0071331 A1 | 4/2003 | Yamaguchi et al. |
| 2004/0016942 A1 | 1/2004 | Miyazawa et al. |
| 2004/0017012 A1 | 1/2004 | Yamada et al. |
| 2004/0043607 A1 | 3/2004 | Farnworth et al. |
| 2004/0104454 A1 | 6/2004 | Takaoka et al. |
| 2004/0155354 A1 | 8/2004 | Hanaoka et al. |
| 2004/0178495 A1 | 9/2004 | Yean et al. |
| 2004/0188819 A1 | 9/2004 | Farnworth et al. |
| 2004/0188822 A1 | 9/2004 | Hara |
| 2004/0217483 A1 * | 11/2004 | Hedler et al. ................. 257/774 |
| 2004/0222508 A1 | 11/2004 | Aoyagi |
| 2004/0251525 A1 | 12/2004 | Zilber et al. |
| 2004/0259292 A1 | 12/2004 | Beyne et al. |
| 2005/0012225 A1 | 1/2005 | Choi et al. |
| 2005/0046002 A1 | 3/2005 | Lee et al. |
| 2005/0051883 A1 | 3/2005 | Fukazawa |
| 2005/0056903 A1 | 3/2005 | Yamamoto et al. |
| 2005/0106845 A1 | 5/2005 | Halahan et al. |
| 2005/0156330 A1 | 7/2005 | Harris |
| 2005/0248002 A1 | 11/2005 | Newman et al. |
| 2005/0260794 A1 | 11/2005 | Lo et al. |
| 2005/0279916 A1 | 12/2005 | Kang et al. |
| 2005/0282374 A1 | 12/2005 | Hwang et al. |
| 2005/0287783 A1 | 12/2005 | Kirby et al. |
| 2006/0001174 A1 | 1/2006 | Matsui |
| 2006/0017161 A1 | 1/2006 | Chung et al. |
| 2006/0043598 A1 | 3/2006 | Kirby et al. |
| 2006/0046348 A1 | 3/2006 | Kang |
| 2006/0046463 A1 | 3/2006 | Watkins et al. |
| 2006/0046471 A1 | 3/2006 | Kirby et al. |
| 2006/0068580 A1 | 3/2006 | Dotta |
| 2006/0071347 A1 | 4/2006 | Dotta |
| 2006/0076019 A1 | 4/2006 | Ho |
| 2006/0079019 A1 | 4/2006 | Kim |
| 2006/0094231 A1 | 5/2006 | Lane et al. |
| 2006/0115932 A1 | 6/2006 | Farnworth et al. |
| 2006/0175697 A1 | 8/2006 | Kurosawa et al. |
| 2006/0197216 A1 | 9/2006 | Yee |
| 2006/0197217 A1 | 9/2006 | Yee |
| 2006/0264029 A1 | 11/2006 | Heck et al. |
| 2006/0278898 A1 | 12/2006 | Shibayama |
| 2006/0292866 A1 | 12/2006 | Borwick et al. |
| 2007/0035020 A1 | 2/2007 | Umemoto |
| 2007/0052050 A1 | 3/2007 | Dierickx |
| 2007/0096295 A1 * | 5/2007 | Burtzlaff et al. .............. 257/704 |
| 2007/0126085 A1 | 6/2007 | Kawano et al. |
| 2007/0249095 A1 | 10/2007 | Song et al. |
| 2007/0269931 A1 | 11/2007 | Chung et al. |
| 2007/0290300 A1 * | 12/2007 | Kawakami ..................... 257/621 |
| 2008/0002460 A1 * | 1/2008 | Tuckerman et al. .......... 365/158 |
| 2008/0020898 A1 | 1/2008 | Pyles et al. |
| 2008/0076195 A1 | 3/2008 | Shiv |
| 2008/0090333 A1 | 4/2008 | Haba et al. |
| 2008/0099900 A1 * | 5/2008 | Oganesian et al. ........... 257/678 |
| 2008/0099907 A1 * | 5/2008 | Oganesian et al. ........... 257/693 |
| 2008/0116544 A1 | 5/2008 | Grinman et al. |
| 2008/0136038 A1 * | 6/2008 | Savastiouk et al. ........... 257/774 |
| 2008/0150089 A1 | 6/2008 | Kwon et al. |
| 2008/0157273 A1 | 7/2008 | Giraudin et al. |
| 2008/0164574 A1 * | 7/2008 | Savastiouk et al. ........... 257/621 |
| 2008/0246136 A1 | 10/2008 | Haba et al. |
| 2008/0284041 A1 | 11/2008 | Jang et al. |
| 2009/0014843 A1 | 1/2009 | Kawashita et al. |
| 2009/0026566 A1 | 1/2009 | Oliver et al. |
| 2009/0032951 A1 | 2/2009 | Andry et al. |
| 2009/0032966 A1 | 2/2009 | Lee et al. |
| 2009/0039491 A1 | 2/2009 | Kim et al. |
| 2009/0065907 A1 | 3/2009 | Haba et al. |
| 2009/0133254 A1 * | 5/2009 | Kubota et al. .................... 29/847 |
| 2009/0212381 A1 | 8/2009 | Crisp et al. |
| 2009/0224372 A1 | 9/2009 | Johnson |
| 2009/0263214 A1 | 10/2009 | Lee et al. |
| 2009/0267183 A1 | 10/2009 | Temple et al. |
| 2009/0309235 A1 | 12/2009 | Suthiwongsunthorn et al. |
| 2010/0013060 A1 | 1/2010 | Lamy et al. |
| 2010/0127346 A1 | 5/2010 | DeNatale et al. |
| 2010/0148371 A1 | 6/2010 | Kaskoun et al. |
| 2010/0155940 A1 * | 6/2010 | Kawashita et al. ........... 257/737 |
| 2010/0159699 A1 | 6/2010 | Takahashi |
| 2010/0164062 A1 | 7/2010 | Wang et al. |
| 2010/0167534 A1 | 7/2010 | Iwata |
| 2010/0230795 A1 * | 9/2010 | Kriman et al. ................. 257/686 |
| 2012/0018863 A1 * | 1/2012 | Oganesian et al. ........... 257/676 |
| 2012/0018895 A1 * | 1/2012 | Oganesian et al. ........... 257/773 |
| 2012/0068352 A1 * | 3/2012 | Oganesian et al. ........... 257/774 |

FOREIGN PATENT DOCUMENTS

| | | | |
|---|---|---|---|
| EP | 0926723 | A1 | 6/1999 |
| EP | 1482553 | A2 | 12/2004 |
| EP | 1519410 | A1 | 3/2005 |
| EP | 1551060 | A1 | 7/2005 |
| EP | 1619722 | A1 | 1/2006 |
| EP | 1653510 | A2 | 5/2006 |
| EP | 1653521 | A1 | 5/2006 |
| EP | 1686627 | A1 | 8/2006 |
| JP | 60160645 | A | 8/1985 |
| JP | 11195706 | A | 7/1999 |
| JP | 2001085559 | A | 3/2001 |
| JP | 2001-217386 | A | 8/2001 |
| JP | 2002217331 | A | 8/2002 |
| JP | 2004200547 | A | 7/2004 |
| JP | 2005026405 | A | 1/2005 |
| JP | 2005093486 | A | 4/2005 |
| JP | 2005101268 | A | 4/2005 |
| JP | 2007053149 | A | 3/2007 |
| JP | 2007157844 | A | 6/2007 |
| JP | 2007317887 | A | 12/2007 |
| JP | 2008-091632 | A | 4/2008 |
| JP | 2008-177249 | A | 7/2008 |

| JP | 2008-258258 A | 10/2008 |
| JP | 2010-028601 A | 2/2010 |
| KR | 19990088037 | 12/1999 |
| KR | 20040066018 A | 7/2004 |
| KR | 20060009407 A | 1/2006 |
| KR | 2006-0020822 A | 3/2006 |
| KR | 20070065241 A | 6/2007 |
| KR | 100750741 B1 | 8/2007 |
| KR | 20100087566 A | 8/2010 |
| WO | 2004114397 | 12/2004 |
| WO | 2008/054660 A2 | 5/2008 |
| WO | 2009023462 A1 | 2/2009 |

OTHER PUBLICATIONS

U.S. Appl. No. 11/590,616, filed Oct. 31, 2006.
U.S. Appl. No. 11/789,694, filed Apr. 25, 2007.
U.S. Appl. No. 12/784,841.
Partial International Search Report, PCT/US2008/002659.
International Search Report, PCT/US2008/002659.
U.S. Appl. No. 12/842,717.
U.S. Appl. No. 12/842,612.
U.S. Appl. No. 12/842,651.
International Search Report and Written Opinion, PCT/US2010/002318, dated Nov. 22, 2010.
International Search Report and Written Opinion, PCT/US2010/052458, dated Jan. 31, 2011.
Supplementary European Search Report, EP 08795005 dated Jul. 5, 2010.
International Search Report, PCT/US10/52783, Dated Dec. 10, 2010.
International Search Report and Written Opinion, PCT/US2010/052785, Dated Dec. 20, 2010.
International Search Report and Written Opinion for PCT/US2011/051552 dated Apr. 11, 2012.
International Search Report and Written Opinion for PCT/US2011/051556 dated Feb. 13, 2012.
Japanese Office Action for Application No. 2009-552696 dated Aug. 14, 2012.

* cited by examiner

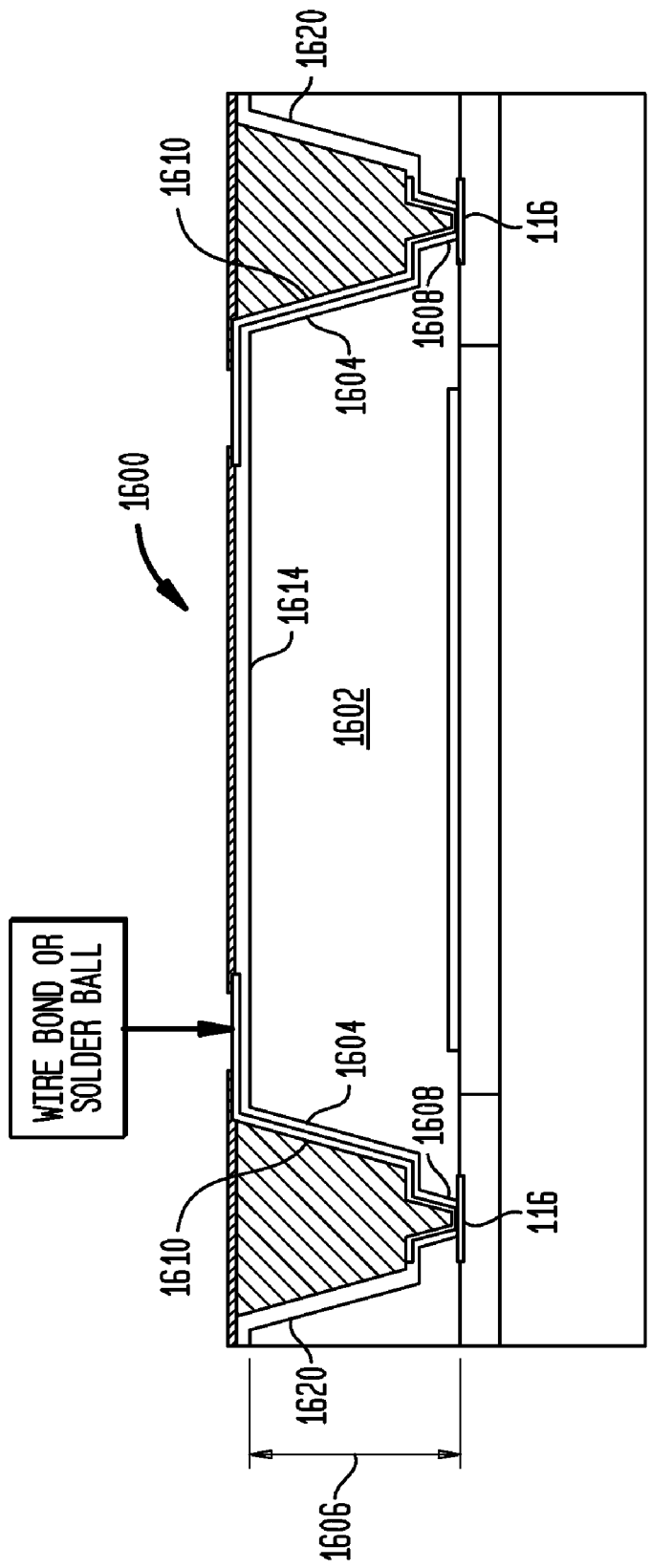

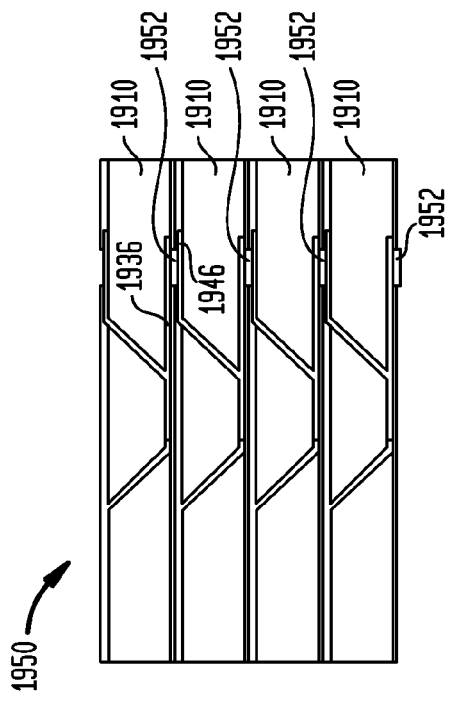
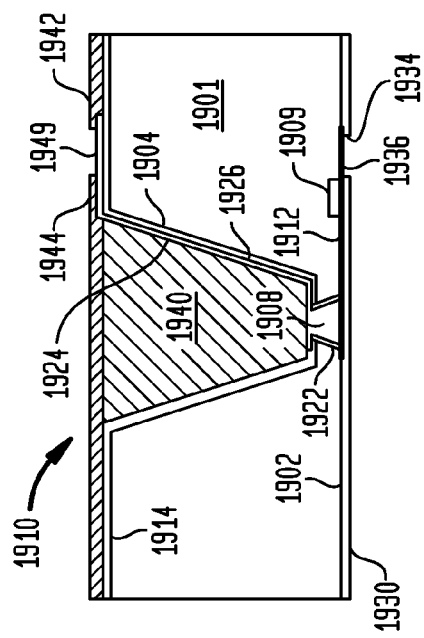
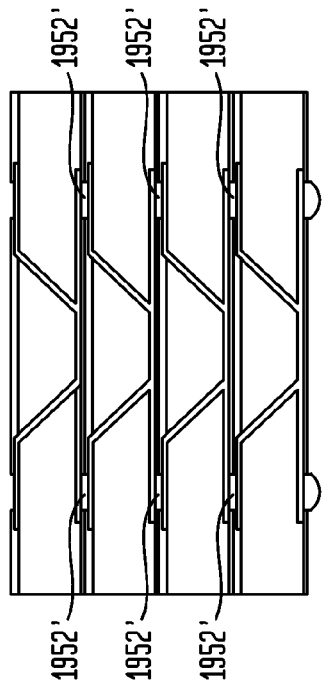
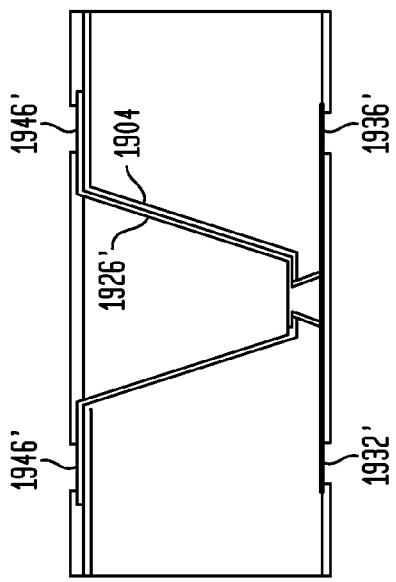
FIG. 19A
FIG. 19D
FIG. 19E
FIG. 19F

CAPACITIVE TRENCHES

CHIPS HAVING REAR CONTACTS CONNECTED BY THROUGH VIAS TO FRONT CONTACTS

CROSS-REFERENCE TO RELATED APPLICATIONS

This application is a division of U.S. application Ser. No. 12/072,508 filed Feb. 26, 2008, which claims the benefit of the filing date of U.S. Provisional Patent Application No. 60/905,096 filed Mar. 5, 2007. The disclosures of said applications are incorporated herein by reference.

BACKGROUND OF THE INVENTION

The present invention relates to packaging of microelectronic devices, especially the packaging of semiconductor devices.

Certain types of microelectronic devices and semiconductor chips include devices such as acoustic transducers, radio frequency emitters, radio frequency detectors or optoelectronic devices or a combination of such devices. Such devices typically require packaging which permits the passage of energy, e.g., acoustic, radio frequency or optical wavelength energy to and from devices at a face of a semiconductor chip.

Because such devices are often exposed at a front face of the microelectronic devices, they usually require protection from the elements, such as dust, other particles, contaminants or humidity. For this reason, it is advantageous to assemble the microelectronic device with a lid or other element covering the front face of such microelectronic device at an early stage of processing.

It is desirable in some types of microelectronic systems to mount chips and packaged chips having very small, i.e., chip-scale packages, to circuit panels. In some cases it is desirable to stack and interconnect chips to each other one on top of another to increase the circuit density of the assembly.

Some types of mass-produced chips also require packaging costs to be tightly controlled. Processing used to package such semiconductor chips can be performed on many chips simultaneously while the chips remain attached to each other in form of a wafer or portion of a wafer. Such "wafer-level" processing typically is performed by a sequence of processes applied to an entire wafer, after which the wafer is diced into individual chips. Advantageously, wafer-level packaging processes produce packaged chips which have the same area dimensions as the original semiconductor chips, making their interconnection compact on circuit panels and the like.

SUMMARY

In accordance with an aspect of the invention, a microelectronic unit is provided in which a semiconductor element has a front surface and a rear surface remote from the front surface. The front and rear surfaces may define a thin region which has a first thickness and a thicker region having a second thickness being at least about twice the first thickness. In such microelectronic unit, the semiconductor element may include a semiconductor device at the front surface and a plurality of first conductive contacts at the front surface connected to the device. A plurality of conductive vias may extend from the rear surface through the thin region of the semiconductor element to the first conductive contacts. A plurality of second conductive contacts can be exposed at an exterior of the semiconductor element, and a plurality of conductive traces may connect the second conductive contacts to the conductive vias.

A microelectronic unit is provided in accordance with another aspect of the invention. In such microelectronic unit, a semiconductor element has a front surface, a semiconductor device at the front surface and a rear surface remote from the front surface. First conductive contacts may be provided at the front surface. The semiconductor element may also have first holes having a first depth extending from the rear surface partially through the semiconductor element towards the front surface. Such second holes may have a second depth which extends from the first holes to the first conductive contacts. A plurality of first conductive vias may extend along walls of the second holes to contact the first conductive contacts. A plurality of conductive interconnects may be connected to the first conductive vias. In one embodiment, such conductive interconnects may extend along walls of the first holes. A plurality of second conductive contacts may be connected to the conductive interconnects. In one example, the second contacts may be exposed at an exterior of the semiconductor element.

In accordance with an aspect of the invention, a microelectronic unit is provided which may includes a semiconductor element having a front surface, a semiconductor device at the front surface and a plurality of first conductive contacts at the front surface connected to the device. A lid may be provided which has an inner surface confronting the front surface of the semiconductor element and an outer surface remote from the inner surface. First holes having a first depth may extend from the outer surface at least partially through the lid towards the inner surface. A support structure may be provided which supports the inner surface of the lid above the front surface of the semiconductor element. In one example, the support structure has second holes which are aligned with the first holes. The second holes may extend through the support structure to the first conductive contacts. A plurality of first conductive vias may extend along walls of the second holes to contact the first conductive contacts. A plurality of second conductive vias may extend along walls of the first holes. A plurality of second conductive contacts may be exposed at an exterior of the lid. In one example, a plurality of conductive traces connect such second conductive contacts to the conductive vias.

In accordance with an aspect of the invention, a microelectronic unit is provided which includes a semiconductor element having a front surface and a semiconductor device at the front surface of the semiconductor element. A plurality of first conductive contacts may be provided at the front surface which are connected to the device. The microelectronic unit may additionally include a lid having an inner surface confronting the front surface of the semiconductor element and an outer surface remote from the inner surface. The inner and outer surfaces of the lid may define a thin region having a first thickness and a thicker region having a second thickness being at least about twice the first thickness. Such lid may further include a plurality of conductive vias extending from the outer surface through the thin region of the lid to connect to the first conductive contacts. Such microelectronic unit may further include a plurality of second conductive contacts. A plurality of conductive traces may also connect the second conductive contacts to the conductive vias.

In accordance with an aspect of the invention, a microelectronic unit is provided which may include a lid having an inner surface confronting the front surface of a semiconductor element and an outer surface remote from the front surface. A plurality of conductive vias may extend through the lid to contact the first conductive contacts. Such microelectronic unit may additionally include a plurality of second conductive contacts overlying the outer surface of the lid. A plurality of conductive traces may connect the second conductive contacts to the conductive vias.

In accordance with an aspect of the invention, a microelectronic unit is provided which includes a semiconductor element having a front surface, a semiconductor device at the front surface and a rear surface remote from the front surface. Front conductive contacts may be exposed at the front surface. Rear conductive contacts may be exposed at the rear surface. A plurality of conductive vias may be connected to the front conductive contacts, the conductive vias extending downwardly from the front surface. An opening may extend downwardly from the rear surface in registration with at least one of the conductive vias. A conductive trace may extend upwardly from at least one of the conductive vias along a wall of the opening. Such conductive trace may be connected to at least one of the rear conductive contacts.

In accordance with an aspect of the invention, a microelectronic unit is provided which includes a semiconductor element having a front surface, a semiconductor device at the front surface and a rear surface remote from the front surface. Rear conductive contacts may be exposed at the rear surface. In such microelectronic unit, a plurality of conductive vias may extend downwardly from the front surface. An opening may extend downwardly from the rear surface in registration with at least one of the conductive vias. A conductive bump can be joined to one of the conductive vias within the opening. In such case, the conductive bump may extend from the conductive via to a position above a plane defined by the rear surface.

In accordance with an aspect of the invention, a microelectronic unit is provided which includes a semiconductor element having a front surface, a semiconductor device at the front surface and a rear surface remote from the front surface. Rear conductive contacts may be exposed at the rear surface. A plurality of conductive vias may extend downwardly from the front surface. An opening can extend downwardly from the rear surface in registration with at least one of the conductive vias. A conductive bump can be joined to one of the conductive vias at the front surface. The conductive bump may extend upwardly from the front surface, for example.

A method of fabricating a microelectronic unit is provided in accordance with another aspect of the invention. Such method may include providing a semiconductor element having a front surface, a rear surface remote from the front surface and a semiconductor device at the front surface. First conductive contacts may be provided at the front surface of the semiconductor element which are connected to the device. A plurality of conductive vias may extend from the rear surface through the semiconductor element to the first conductive contacts. Such method may further include forming a plurality of second conductive contacts overlying the rear surface and a plurality of conductive traces, the conductive traces connecting the second conductive contacts to the conductive vias.

A method of fabricating a microelectronic unit is provided in accordance with another aspect of the invention in which a semiconductor element is provided which includes a front surface and a semiconductor device at the front surface. First conductive contacts at the front surface may be connected to the semiconductor device. The semiconductor element may further include a rear surface remote from the front surface and semiconductor material exposed at the rear surface. A plurality of through holes may extend from the rear surface through the semiconductor element to the first conductive contacts. A rear dielectric layer may be electrodeposited onto the exposed semiconductor material at the rear surface, along walls of the through holes or both. Second conductive contacts may overlie the rear surface. A plurality of conductive vias may be formed within the through holes which contact the first conductive contacts. A plurality of conductive traces may be formed which connect the second conductive contacts to the conductive vias.

A method of fabricating a microelectronic unit is provided in accordance with another embodiment of the invention. Such method may include assembling a semiconductor element with a cover element overlying a front surface of the semiconductor element to form a unit. The semiconductor element may have first conductive contacts at the front surface connected to the semiconductor device. A rear surface may be provided which is remote from the front surface. A plurality of through holes may extend from the rear surface through the semiconductor element to the first conductive contacts. In one embodiment, the semiconductor material is exposed at the rear surface and at walls of the through holes.

A dielectric layer can be electrodeposited to overlie the exposed semiconductor material at the rear surface and along walls of the through holes. The dielectric layer can also be electrodeposited over the dielectric layer such that conductive vias are formed are formed within the through which contact the first conductive contacts. A plurality of second conductive contacts may overlie the rear surface and a plurality of conductive traces may connect the conductive vias to the second conductive contacts.

BRIEF DESCRIPTION OF THE DRAWINGS

FIG. 16A is a sectional view illustrating a packaged chip in accordance with another embodiment of the invention.

FIG. 19A is a partial sectional view illustrating a packaged chip in accordance with yet another embodiment of the invention.

FIG. 19D is a sectional view illustrating a stacked assembly including a plurality of the packaged chips as shown in FIG. 19A.

FIG. 19E is a partial sectional view illustrating a packaged chip in accordance with a variation of the embodiment of the invention shown in FIG. 19A.

FIG. 19F is a sectional view illustrating a stacked assembly including a plurality of the packaged chips as shown in FIG. 19E.

DETAILED DESCRIPTION

Figure 1:
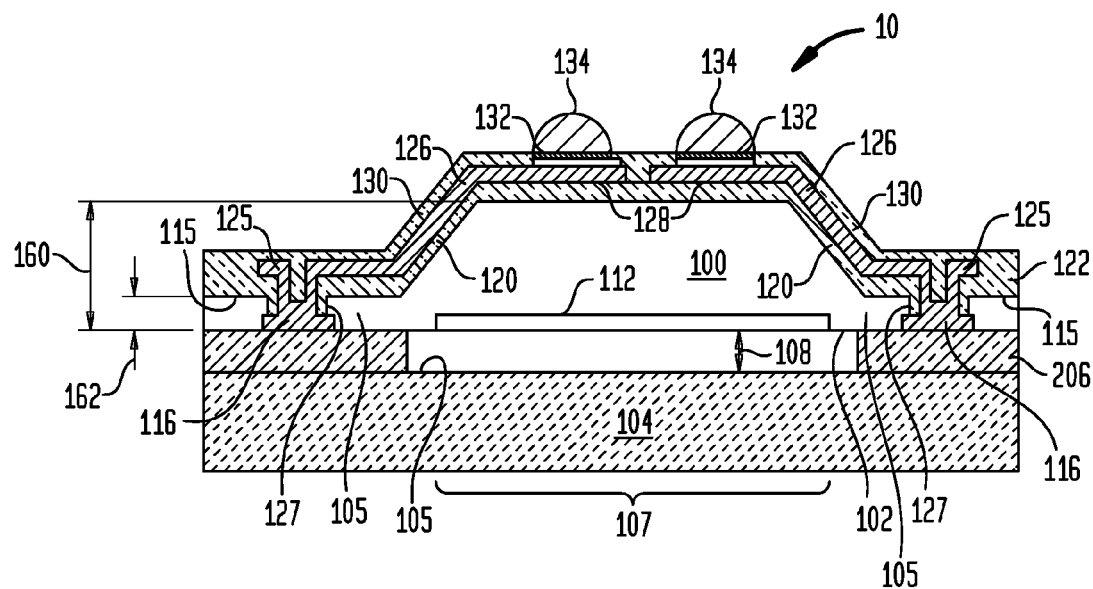
FIG. 1 is a sectional view illustrating a packaged semiconductor chip in accordance with an embodiment of the invention.

FIG. 1 is a sectional view of a packaged semiconductor chip 10 in accordance with an embodiment of the invention. As illustrated in FIG. 1, the packaged chip is shown in an orientation in which a front face 102 of the semiconductor chip faces downwardly. As illustrated in FIG. 1, the packaged chip includes a semiconductor chip 100 having a front face 102 and a rear face 114 remote from the front face. The front face of the chip 100 is covered by a lid or cover 104 which is assembled together with the semiconductor chip 100 to form the packaged chip 10. As illustrated in FIG. 1, the front face 102 of the semiconductor chip 100 is oriented downwardly towards an upwardly facing inner surface 105 of the lid 104. The semiconductor chip 100 typically includes a semiconductor substrate in which one or a plurality of semiconductor devices 112 are disposed in a device region thereof below the front face 102. The semiconductor chip 100 also includes a plurality of dielectric layers overlying the substrate, in which conductive metal wiring layers and vias (not shown) are disposed. The semiconductor devices 112 are disposed at the front face of the chip and/or between the front and rear faces of the chip. The package chip can be referred to as a chip-scale package ("CSP"), because exterior lateral dimensions (e.g., in direction of arrow 102) of the packaged chip 10 are about the same as they would be for a bare chip.

The semiconductor chip 100 typically is connected to the lid 104 through one or more standoff structures 124, which may include an adhesive, an inorganic or organic material and/or a joining metal. Structures for supporting a lid at a constant spacing from a chip are described in the commonly owned U.S. Provisional Application No. 60/761,171 filed on Jan. 23, 2006, and U.S. Provisional Application No. 60/775,086 filed on Feb. 21, 2006, the disclosures of which are hereby incorporated herein by reference. The packaged chip may include an interior cavity 106 between the front face 102 of the chip and the inner surface 105 of the lid 104, as illustrated in FIG. 1. Alternatively, the packaged chip 10 can be constructed without an interior cavity. When the cavity is present, the cavity's height 108 and the lateral dimensions, including lateral dimension 110, are typically determined, as for example, by the height and dimensions of the structure 124 used to assemble the lid 104 with the semiconductor chip 100. In a particular embodiment, the lid 104 consists essentially of a glass or polymeric material and is at least partially transparent to electromagnetic spectra at frequencies of interest. The lid 104 may be only partially transparent to provide a filter function, or may be essentially transparent to a range of frequencies of interest.

The semiconductor devices 112 in the semiconductor chip 100 typically include electromagnetic transducer devices such as electromagnetic or electro-optic devices which either detect or output electromagnetic radiation. The semiconductor devices may be designed to emit or receive radio frequency and/or optical wavelengths of infrared, visible and/or ultraviolet or higher wavelength spectra including but not limited to x-ray wavelengths. Alternatively, the semiconductor devices 112 can include acoustic transducer devices, such devices being designed to convert sound pressure waves received through a medium, e.g., air and/or other fluid medium (gas or liquid) to one or more electrical signals, or to convert one or more electrical signals into sound pressure waves.

In a particular embodiment, the packaged chip is a sensor unit in which the semiconductor devices 112 of the chip 100 include an imaging area 107 for capturing an image. Electronic circuits (not shown) in chip 100 are connected to the semiconductor devices in the imaging area 107 for generating one or more electrical signals representing an image captured by the imaging area 107. Numerous electrical circuits are well known in the imaging art for this purpose. For example, the semiconductor chip 100 may be a generally conventional charge-coupled device (CCD) imaging chip with conventional circuits such as clocking and charge-to-voltage conversion circuits.

As seen in FIG. 1, the semiconductor chip includes a plurality of front contact pads 116 at the front face of the semiconductor chip. While not specifically shown in FIG. 1, the semiconductor devices 112 in the device region are conductively connected to the front contact pads 116. The semiconductor device, thus, are accessible conductively through wiring incorporated extending within or above one or more dielectric layers of the semiconductor chip 100.

The semiconductor chip has surfaces 120 which are set at an angle away from the rear surface. As illustrated in FIG. 1, surfaces 120 may be sloped away from the rear face at angles other than right angles and the slope may either be gradual, e.g., having an angle of less than 45 degrees with respect to a normal to the rear surface, or the slope may be more abrupt, in which such angle is greater than 45 degrees relative to the normal. Alternatively, the surfaces 120 may be at right angles to the rear face. The surfaces 120 end at lowered rear surfaces 115. The lowered rear surfaces 115 face away from the front face 102 and are spaced therefrom by thinned regions 105 of the semiconductor chip 100.

Conductive vias 125 extend between the front face 102 of the chip 100 and the lowered rear surfaces 115. The conductive vias provide conductive interconnection between the front contact pads 116 and conductive traces 126 overlying the lowered rear surfaces 115 and surfaces 120. The conductive vias 125 include a conductive layer overlying a dielectric layer 122 disposed within holes 127 extending between the front face and the lowered rear surfaces. Between the front face 102 and the lowered rear surface, the walls of the holes 127 can extend vertically, i.e., at right angles relative to the front face. Alternatively, the holes 127 can be tapered in a direction from the lowered rear surface towards the front face such that the holes become smaller with increasing distance from the lowered rear surface. In yet another alternative, the holes 127 can be tapered in a direction from the front face towards the lowered rear surface such that the holes become smaller with increasing depth from the front face. Each of the embodiments described below can include holes having any one of these available hole geometries.

In the example shown in FIG. 1, the conductive vias 125 are in form of conductive traces extending extend upwardly from the contact pads 116 of the chip along walls of the holes 127, the traces continuing upwardly along wall 120 and onto the rear face 114. Alternatively, the conductive vias 125 can be in form of holes 127 filled with conductive material, e.g., a metal. In such case, traces 126 can extend from individual ones of the vias along a wall 120 and onto the rear face 114.

The dielectric layer 122 preferably includes a conformally coated dielectric material. Preferably, there are no breaks in the conformal coating and the dielectric layer 122 provides good dielectric isolation with respect to the semiconductor chip 100. Desirably, the dielectric layer 122 is a compliant layer, having sufficiently low modulus of elasticity and sufficient thickness such that the product of the modulus and the thickness provide compliancy. Specifically, such compliant layer can allow the contacts 128 and traces 126 attached thereto to flex somewhat. In that way, the bond between external conductive bumps 134 of the packaged chip 10 and terminals of a circuit panel (not shown) can better withstand thermal strain due to mismatch of the coefficient of thermal expansion ("CTE") between the packaged chip 10 and a circuit panel (not shown). Desirably, the degree of compliancy provided by the product of the thickness of the dielectric layer 122 and its modulus are sufficient to compensate for strain applied to the conductive bumps due to thermal expansion mismatch between the chip 100 and the circuit panel. An underfill (not shown) can be provided between the exposed surface of the dielectric layer 130 and such circuit panel to enhance resistance to thermal strain due to CTE mismatch.

With further reference to FIG. 1, the conductive traces 126 conductively connect the conductive vias 125 to corresponding package contact pads 128 which overlie an exterior surface of the packaged chip 10. As specifically shown in FIG. 1, the package contact pads 128 overlie the rear face 114 of the semiconductor chip 100. The conductive traces 126 overlie the second dielectric layer 122 and extend over portions of the surfaces 120 and rear face 114 of the semiconductor chip. Desirably, the conductive traces 126 connect individual front contact pads 116 of the chip 100 with corresponding individual package contact pads 128. Conductive bumps 134 may be provided on the contact pads 128. The thickness 160 of the microelectronic element 100 between the front and rear faces typically is less than 200 μm, and can be significantly smaller, for example, 130 nm, 70 nm or even smaller. The thickness 162 of the microelectronic element between the lowered surface 115 and the front face 102 normally will be one half or less than one half of the thickness 160. Desirably, the thickness 162 of the microelectronic element at the lowered surface is significantly less than one half the thickness 160. In one example, the thickness 162 is approximately 10 microns.

As further shown in FIG. 1, a second dielectric layer 130 overlies the conductive traces 126 and provides external isolation therefor. This layer can be referred to as an "external passivation layer" 130 of the package 10. The second dielectric layer can include an inorganic or organic dielectric material or both. The second dielectric may include an electrodeposited conformal coating or other dielectric material, for example, a photoimageable polymeric material, for example, a solder mask material. Photoimageable solder mask materials can be obtained from various manufacturers including Shipley and Toyo, among others.

In a particular embodiment, a metal structure 132 including a metal layer or stack of metal layers including a wettable metal layer overlies the package contact pads 128, and conductive bumps 134 overlie the metal structure 132. Typically, the conductive bumps 134 include a fusible metal having a relatively low melting temperature such as solder, tin, or a eutectic mixture including a plurality of metals. Alternatively, the bumps 134 include a wettable metal, e.g., copper or other noble metal or non-noble metal having a melting temperature higher than that of solder or other fusible metal. Such wettable metal can be joined with a corresponding feature, e.g., a fusible metal feature of an interconnect element such as a circuit panel to externally interconnect the packaged chip 10 to such interconnect element. In another alternative, the bumps 134 include a conductive material interspersed in a medium, e.g., a conductive paste, e.g., metal-filled paste, solder-filled paste or isotropic conductive adhesive or anisotropic conductive adhesive.

Figure 2:
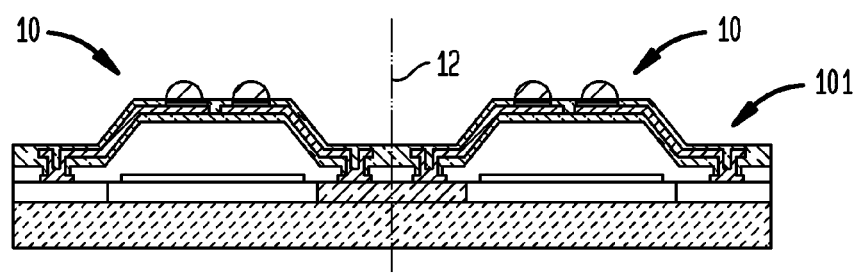
FIG. 2 is a sectional view illustrating a stage in a method of simultaneous fabrication of a plurality of packaged semiconductor chips in accordance with an embodiment of the invention.

Referring to FIG. 2, semiconductor chips 100 preferably are packaged simultaneously by wafer-level processing, i.e., by processing performed simultaneously to a plurality of semiconductor chips 100 while they remain joined together as a portion of a waver or as an entire semiconductor device wafer 101. After reaching a stage of fabrication illustrated in FIG. 2, the assembly of wafer with the attached lid 104 is severed along dicing lane 12 and other dicing lanes not visible within the view of FIG. 2 into individual packaged semiconductor chips.

Figure 3A:
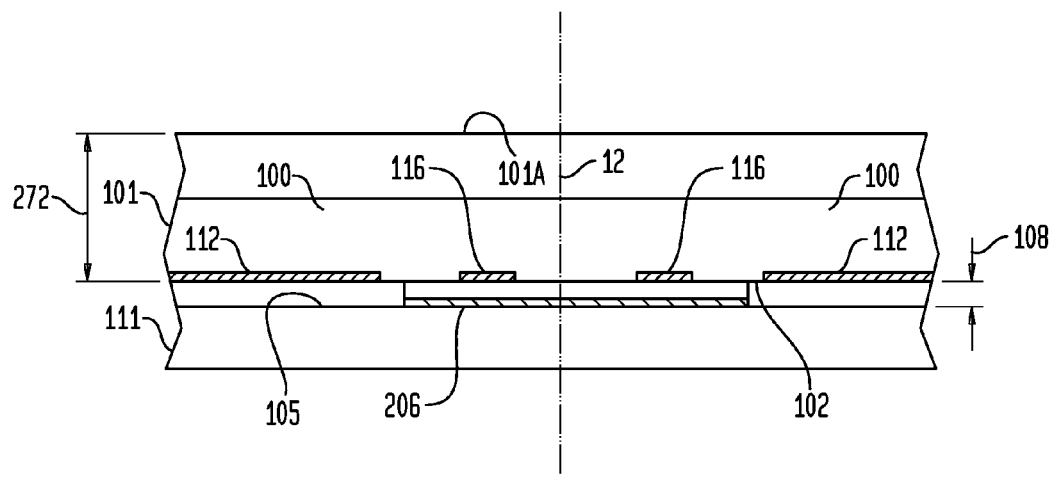
FIGS. 3A and 3B are a sectional view and a corresponding top-down plan view illustrating a stage of fabrication in accordance with an embodiment of the invention.
Figure 3B:
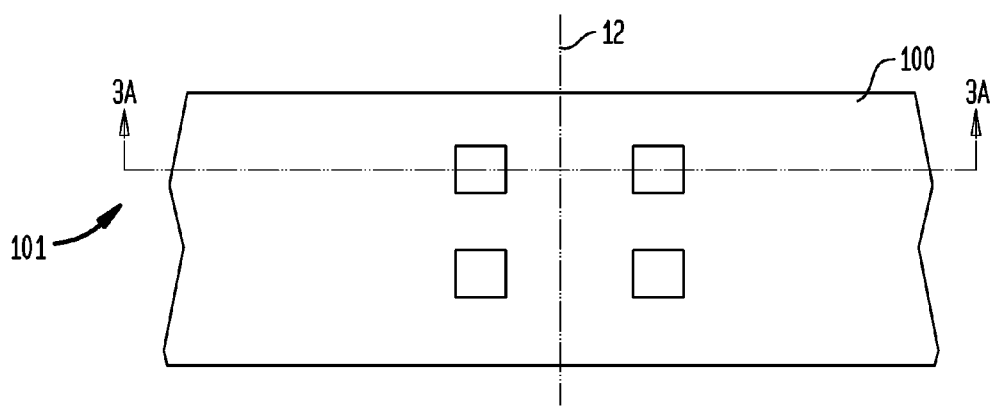

A method of simultaneously fabricating a plurality of packaged chips 10 (FIG. 1) will now be described, with reference to FIGS. 3A through 10B. As illustrated in FIG. 3A, a semiconductor device wafer or portion of a device wafer containing a plurality of chips 100 is mounted to a lid member 111 such that front faces 102 of the chips 100 having device regions 112 and front contacts 116 thereon, confront the lid member 111. Desirably, the lid member 111 preferably has dimensions in lateral directions (directions extending in a plane defined by the inner surface 105) which are the same as those of the semiconductor device wafer 101. Reference 12 indicates a location of a dicing lane at a boundary between individual chips 100. Dicing lanes 12 of the wafer need not be very wide. The locations of bond pads 116 of the chip 100 need not be specially located, such that the bond pads usually are well away from the dicing lanes. A representative width of the dicing lane is approximately 40 μm (microns). As illustrated in plan view in FIG. 3B, a rear face 101A of the device wafer overlies the front faces 102 of the chips. Desirably, at this stage of fabrication, the rear face 101A is spaced uniformly from the front faces 102 of the chip by an initial thickness 272 of the device wafer. Locations of the bond pads 116 underlying the device wafer and dicing lane 12 are indicated in a corresponding plan view (FIG. 3B) looking toward the rear face 101A of the device wafer.

Figure 3C:
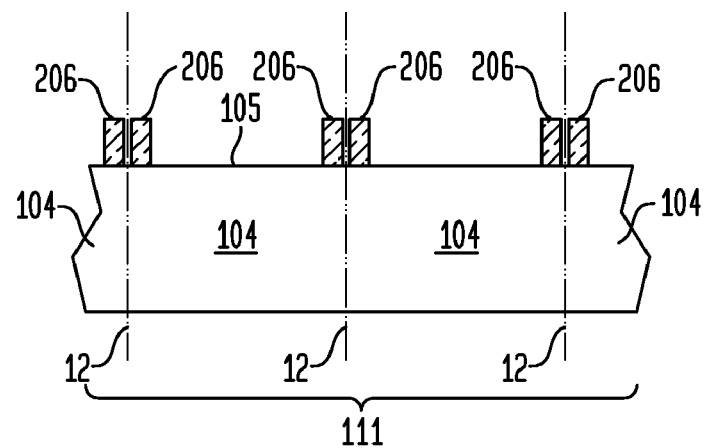
FIGS. 3C and 3D are a sectional view and a corresponding plan view illustrating preparation of a lid member in a stage in a method of fabrication in accordance with an embodiment of the invention.
Figure 3D:
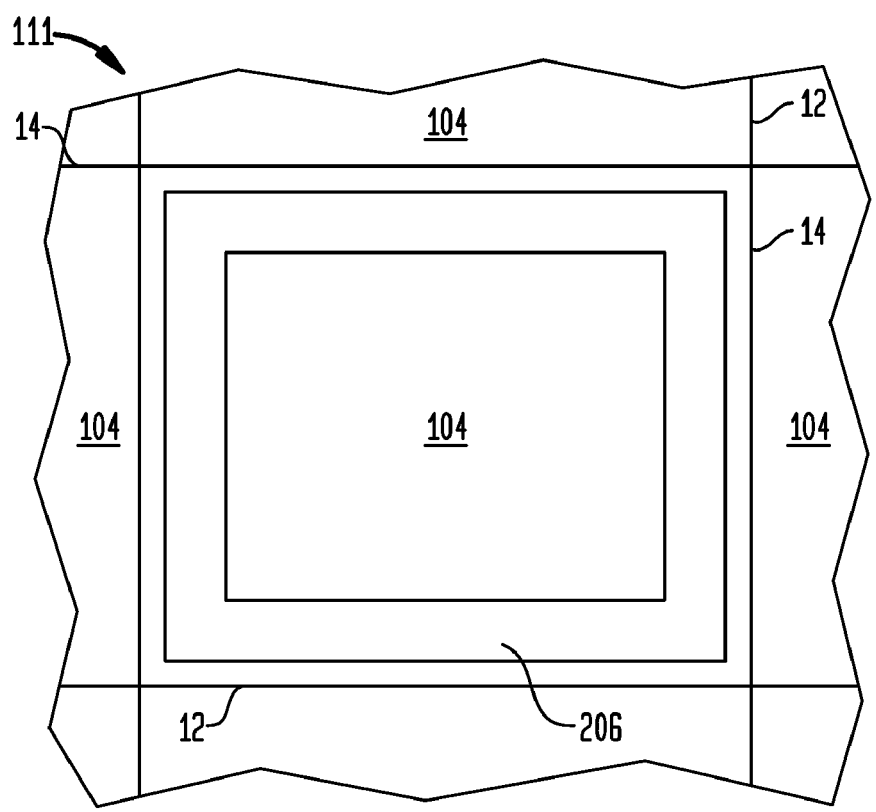

As further illustrated in FIG. 3A, a standoff structure 206 supports the device wafer 101 at a distance 108 above the inner surface 105 of the lid member 111. FIG. 3C illustrates a preliminary stage of fabrication in which a plurality of standoff structures 206 can be formed extending outward from a major surface of the lid member 111 containing individual lid elements 104 attached together at dicing lanes 12. As best seen in FIG. 3D, each standoff structure 206 typically has a rectangular shape aligned with vertically oriented dicing lanes 12 and aligned with horizontally oriented dicing lanes 14 which lie at the boundaries between individual lids to be severed from the original lid member 111. As illustrated in FIG. 3D, the standoff structure 206 has a form which can be described as that of a "picture frame ring shape." As described above, the standoff structure can include one or more inorganic dielectric materials, organic dielectric materials, semiconductors, conductors such as one or more metals, metallic compounds or a combination of such materials. The standoff structure can be fabricated by additive processing or subtractive processing or both, as described in, for example, U.S. patent application Ser. No. 10/949,674 filed Sep. 24, 2004, or U.S. Provisional Application No. 60/761,171, the disclosures of which are hereby incorporated herein by reference. When the standoff structure includes a metal, it can be fabricated by a combination of steps including sputtering of a thin layer of metal followed by subtractive patterning and then electroplating the remaining structure with a final metal. Alternatively, the standoff structure can be formed by electroless plating, followed by subtractive patterning and electroplating. In a particular embodiment, the standoff structure 206 is fabricated by electrophoretic deposition of a polymer onto a pre-existing sputtered or plated conductive layer, in a manner such as that described in the herein incorporated U.S. Provisional Application No. 60/775,086.

After joining the device wafer 101 to the lid element 111 as illustrated in FIG. 3A, the thickness of the device wafer can be reduced from the rear face 101A. Grinding, lapping, or polishing from the rear face or a combination thereof can be used to reduce the thickness. During a process performed to reduce the thickness, the lid element 104 overlying the front face of the semiconductor chip assists in providing structural support to the semiconductor chip, increasing its rigidity to permit the thickness of the packaged chip to be reduced as desirable to a smaller thickness. During this step, as an example, the thickness of the device wafer can be reduced from about 700 nm to about 130 nm or less.

Figure 4:
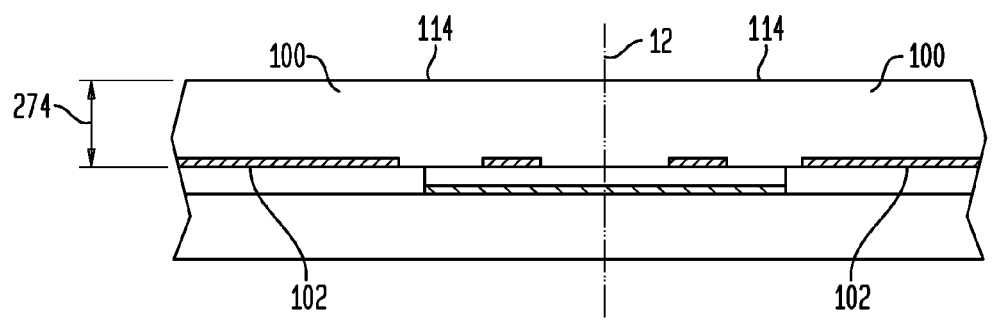
FIG. 4 is a sectional view illustrating a stage in a method of fabrication in accordance with an embodiment of the invention.
Figure 5A:
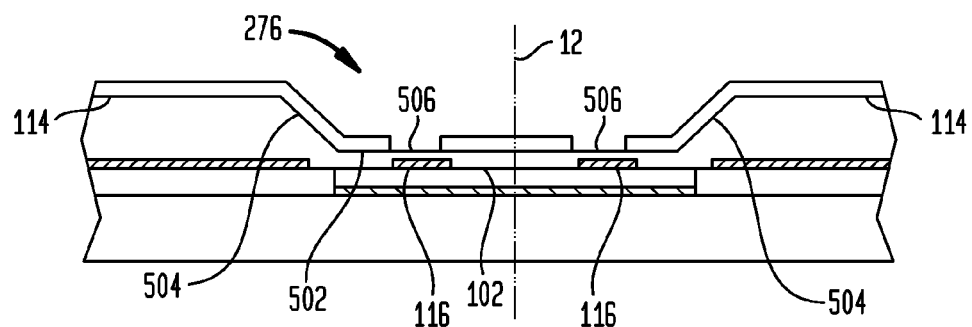
FIGS. 5A and 5B are a sectional view and a corresponding top-down plan view illustrating a stage of fabrication in accordance with an embodiment of the invention.
Figure 5B:
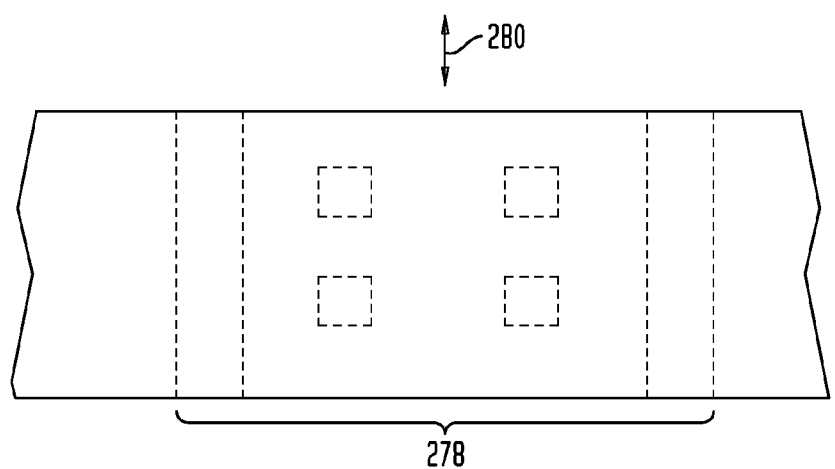
Figure 6A:
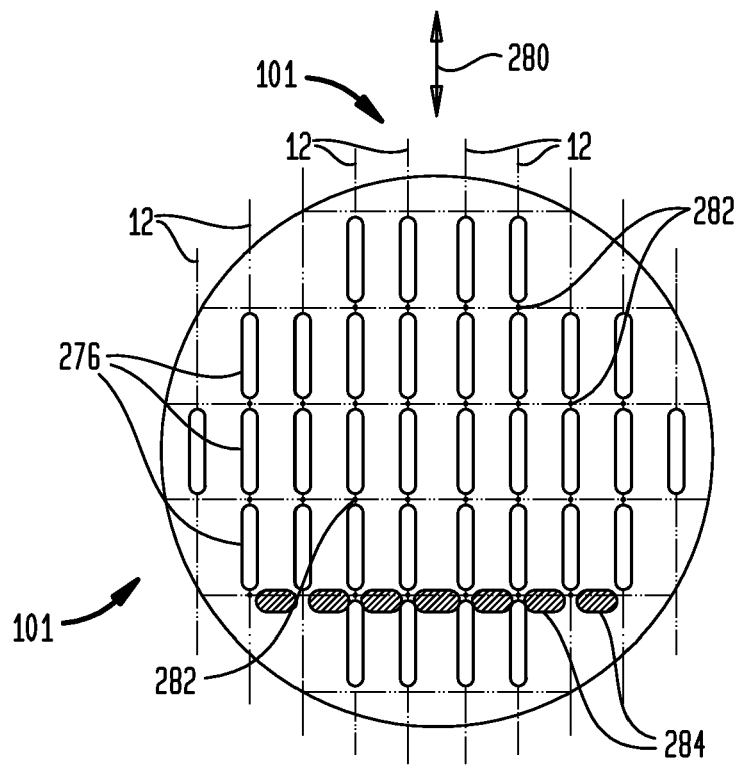
FIG. 6A is a plan view illustrating a stage of fabrication in accordance with an embodiment of the invention.
Figure 6B:
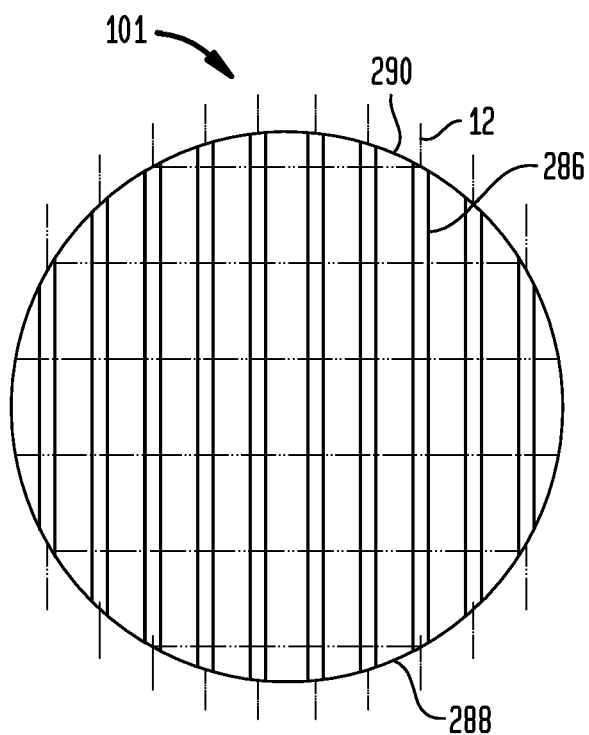
FIG. 6B is a plan view illustrating a stage of fabrication in accordance with an alternative embodiment of the invention.

Thereafter, the resulting device wafer has a reduced thickness 274, as shown in FIG. 4 and the rear face 114 is separated from the front face 102 of each chip 100 by the thickness 274. Next, as shown in FIG. 5A, a recess 276 is formed in the device wafer which extends downwardly from the rear face 114 towards the front face 102 of the device wafer. The recess can be formed for example, by selectively etching the device wafer, after forming a mask layer where it is desired to preserve remaining portions of the rear faces 114 of the chips. For example, a photoimageable layer, e.g., photoresist layer can be deposited and patterned to cover only portions of the rear face, after which a timed etch process can be conducted to form the recess 276. The recess can be formed as a stripe 278 extending in a linear direction 280 over the device wafer in alignment with the dicing lane 12. As best seen FIG. 6A, elongated recesses 276 desirably are formed simultaneously which extend in a vertical layout direction 280 of the device wafer in alignment with vertically extending dicing lanes. The vertically extending recesses 276 can be formed to extend only along dicing lines of respective pairs of chips. In such case, the recesses may not overlie corner portions of the chips 100 at intersections between the vertical dicing lanes 12 and horizontal dicing lanes 14 extending in a horizontal layout direction of the device wafer. In another example, horizontally extending recesses 284 can be formed to overlie bond pads adjacent to the horizontal dicing lanes 14 of each chip. Both vertically extending recesses 276 and horizontally extending recesses 284 can be formed in the device wafer. In a particular example, recesses may be formed which overlie bond pads adjacent to only one of the dicing lanes which bound a chip. In another example, the recesses can be formed which overlie only two dicing lanes of the chip or which overlie only three dicing lanes or more dicing lanes which bound a chip. In one example, recesses can be made smaller than as shown in FIG. 6A, such that the recesses overlie only some bond pads of rows of bond pads which lie adjacent to the dicing lanes 12 of the device wafer 101. In yet another example as illustrated in FIG. 6B, recesses 286 aligned with dicing lanes 12 can extend as stripes between respective edges 288, 290 of the device wafer 101.

As particularly shown in FIG. 5A, each recess 276 desirably has a lowered surface 502 which is flat and equidistant from the front face 102. Walls 504 of the recess, extending downwardly from the rear face 114 towards the lowered surfaces, may be sloped, i.e., may extend at angles other a normal angle (right angle) to the rear surface 114, as particularly illustrated in FIG. 5A. Wet etching processes, e.g., isotropic etching processes and sawing using a tapered blade, among others, can be used to form recesses having sloped walls 504 as illustrated in FIG. 5A. Laser dicing, mechanical milling, among others, can also be used to form recesses having sloped walls. Alternatively, instead of being sloped, the walls may extend vertically downwardly from the rear face 114 at right angles to the rear face 114. Anisotropic etching processes, laser dicing, laser drilling, mechanical removal processes, e.g., sawing, milling, ultrasonic machining, among others, can be used to form recesses having essentially vertical walls. After forming the recesses in the device wafer, a photoimageable layer such as a photoresist is deposited onto the rear of the device wafer and patterned to form mask openings 506 overlying the lowered surface 502 in registration with bond pads 116.

Figure 7A:
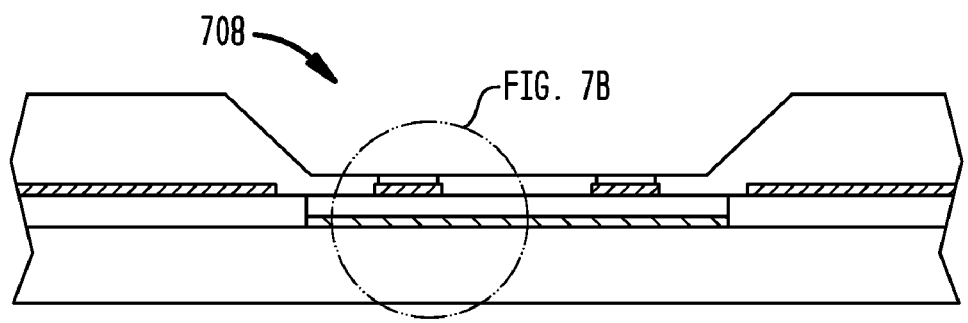
FIGS. 7A, 7B and 7C are a sectional view, a corresponding top-down plan view, and an enlarged view illustrating a stage of fabrication in accordance with an embodiment of the invention.
Figure 7B:
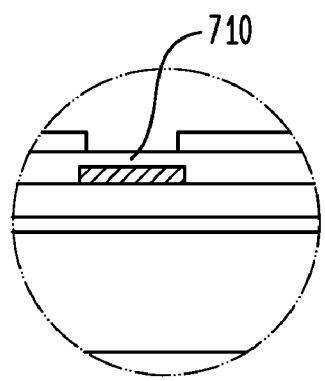
Figure 7C:
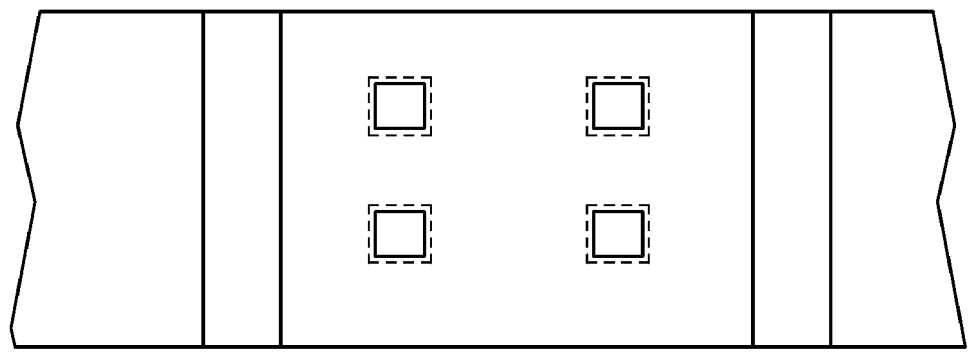

Thereafter, as illustrated in FIG. 7A, an etch process is applied to the portions of the lowered surface 502 exposed within the mask openings so as to remove the semiconductor material underlying the mask openings. As a result, vias 708 are formed which extend between the lowered surface in contact with the front contacts 116. The etch process desirably is conducted in a manner which selectively etches the semiconductor material, e.g., silicon, but preserves oxide material. Typically the front contacts, e.g., bond pads 116 of a chip overlie one or more layers of oxide material or other dielectric material which is used for passivation, as interlevel dielectric layers or other purpose of providing insulation or isolation on the chip. By etching the semiconductor material in a selective manner which preserves the dielectric, over-etching can be performed as needed to etch through the thickness of the semiconductor material in all locations of the device wafer while maintaining a sufficient process window across the device wafer. When a selective etch process is used, preferably as seen in the enlarged fragmentary view of FIG. 7B, the dielectric layer 710, e.g., oxide layer, remains in place after forming the vias 708. Alternatively, laser drilling or mechanical milling can be used to form the vias 708, in which case, surfaces of the front contact pads can be exposed within the vias.

Figure 8A:
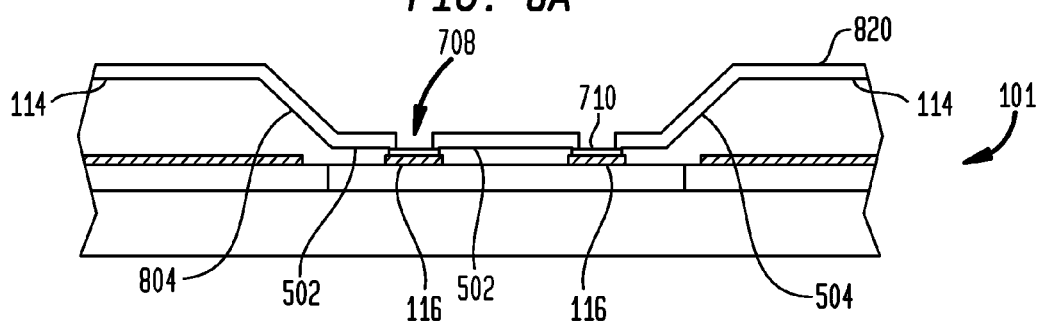
FIGS. 8A and 8B are a sectional view and a corresponding top-down plan view illustrating a stage of fabrication in accordance with an embodiment of the invention.

Thereafter, in the stage of fabrication illustrated in FIG. 8A, a dielectric layer 820 is formed on walls 806 of the vias, walls 504 and the rear surfaces 114 of chips. Various methods can be used to form such dielectric layer. In one example, a flowable dielectric material is applied to the rear surface 114 of a wafer 101 containing chips 100 and the flowable material is then more evenly distributed across the rear surface of the wafer during a "spin-coating" operation, followed by a drying cycle which may include heating. In another example, a thermoplastic film of dielectric material can be applied to the rear surface of the device wafer 101 after which the assembly including the wafer and lid element is heated, causing the film to flow downward onto the lowered surfaces 115 and into the vias 708. In another example, vapor deposition can be used to form the dielectric layer.

In still another example, the assembly including the device wafer with the lid element attached thereto is immersed in a dielectric deposition bath to form a conformal dielectric coating or layer 820. Preferably, an electrophoretic deposition technique is utilized to form the conformal dielectric coating, such that the conformal dielectric coating is only deposited onto exposed conductive and semiconductive surfaces of the assembly. During deposition, the semiconductor device wafer is held at a desired electric potential and an electrode is immersed into the bath to hold the bath at a different desired potential. The assembly is then held in the bath under appropriate conditions for a sufficient time to form an electrodeposited conformal dielectric coating 820 on exposed surfaces of the device wafer which are conductive or semiconductive, including but not limited to along the rear faces 114, walls 504 of the recess, the lowered surface 502 and walls 806 of the vias 708. Electrophoretic deposition occurs so long as a sufficiently strong electric field is maintained between the surface to be coated thereby and the bath. As the electrophoretically deposited coating is self-limiting in that after it reaches a certain thickness governed by parameters, e.g., voltage, concentration, etc. of its deposition, deposition stops. Electrophoretic deposition forms a continuous and uniformly thick conformal coating on conductive and/or semiconductive exterior surfaces of the assembly. In addition, the electrophoretically deposited coating preferably does not form on the remaining dielectric layer 710 overlying the contacts 116, due to its dielectric (nonconductive) property. Stated another way, a property of electrophoretic deposition is that is does not form on a layer of dielectric material overlying a conductor provided that the layer of dielectric material has sufficient thickness, given its dielectric properties. Typically, electrophoretic deposition will not occur on dielectric layers having thicknesses greater than about 10 microns to a few tens of microns.

Preferably, the conformal dielectric layer 820 is formed from a cathodic epoxy deposition precursor. Alternatively, a polyurethane or acrylic deposition precursor could be used. A variety of electrophoretic coating precursor compositions and sources of supply are listed in Table 1 below.

TABLE 1

| ECOAT NAME | POWERCRON 645 | POWERCRON 648 | CATHOGUARD 325 |
|---|---|---|---|
| MANUFACTURERS | | | |
| MFG | PPG | PPG | BASF |
| TYPE | CATHODIC | CATHODIC | CATHODIC |
| POLYMER BASE | EPOXY | EPOXY | EPOXY |
| LOCATION | Pittsburgh, PA | Pittsburgh, PA | Southfield, MI |
| APPLICATION DATA | | | |
| Pb/Pf-free | Pb-free | Pb or Pf-free | Pb-free |
| HAPs, g/L | | 60-84 | COMPLIANT |
| VOC, g/L (MINUS WATER) | | 60-84 | <95 |
| CURE | 20 min/175 C. | 20 min/175 C. | |

TABLE 1-continued

| ECOAT NAME | POWERCRON 645 | POWERCRON 648 | CATHOGUARD 325 |
|---|---|---|---|
| FILM PROPERTIES | | | |
| COLOR | Black | Black | Black |
| THICKNESS, μm | 10-35 | 10-38 | 13-36 |
| PENCIL HARDNESS | | 2H+ | 4H |
| BATH CHARACTERISTICS | | | |
| SOLIDS, % wt. | 20 (18-22) | 20 (19-21) | 17.0-21.0 |
| pH (25 C.) | 5.9 (5.8-6.2) | 5.8 (5.6-5.9) | 5.4-6.0 |
| CONDUCTIVITY (25 C.) μS | 1000-1500 | 1200-1500 | 1000-1700 |
| P/B RATIO | 0.12-0.14 | 0.12-0.16 | 0.15-0.20 |
| OPERATION TEMP., C. | 30-34 | 34 | 29-35 |
| TIME, sec | 120-180 | 60-180 | 120+ |
| ANODE | SS316 | SS316 | SS316 |
| VOLTS | | 200-400 | >100 |
| Pb/Pf-free | | Pb-free | Pb-free |
| HAPs, g/L | | | |
| VOC, g/L (MINUS WATER) | | | |
| CURE | 20 min/149 C. | 20 min/175 C. | 20 min/175 C. |
| FILM PROPERTIES | | | |
| COLOR | Clear (+dyed) | Black | Black |
| THICKNESS, μm | | 10-35 | 10-35 |
| PENCIL HARDNESS | 4H | | |
| BATH CHARACTERISTICS | | | |
| SOLIDS, % wt. | 7.0 (6.5-8.0) | 10-12 | 9-11 |
| pH (25 C.) | 5.5-5.9 | 7-9 | 4.3 |
| CONDUCTIVITY (25 C.) μS | 450-600 | 500-800 | 400-800 |
| P/B RATIO | | | |
| OPERATION TEMP., C. | 27-32 | 23-28 | 23-28 |
| TIME, sec | | | 60-120 |
| ANODE | SS316 | 316SS | 316SS |
| VOLTS | 40, max | | 50-150 |

Figure 8B:
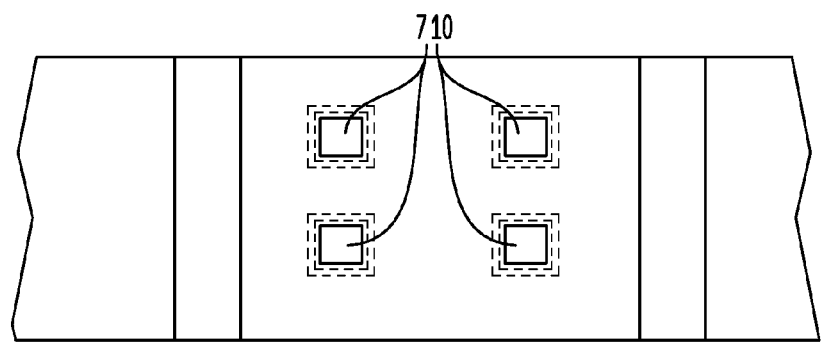

FIG. 8B illustrates that the vias 710 above the bond pads remain open after the electrophoretic deposition. After electrophoretically depositing the conformal dielectric coating, processing is then begun for forming conductive traces which connect the front contact pads of the semiconductor chips to exterior contacts of the packaged chips.

Figure 9A:
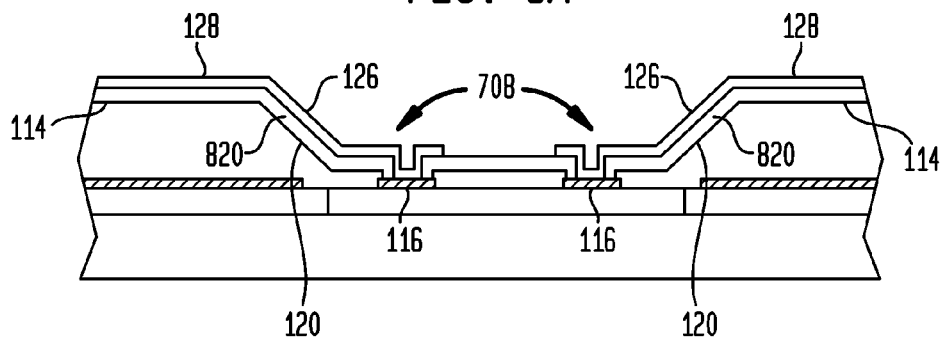
FIGS. 9A and 9B are a sectional view and a corresponding top-down plan view illustrating a stage of fabrication in accordance with an embodiment of the invention.
Figure 9B:
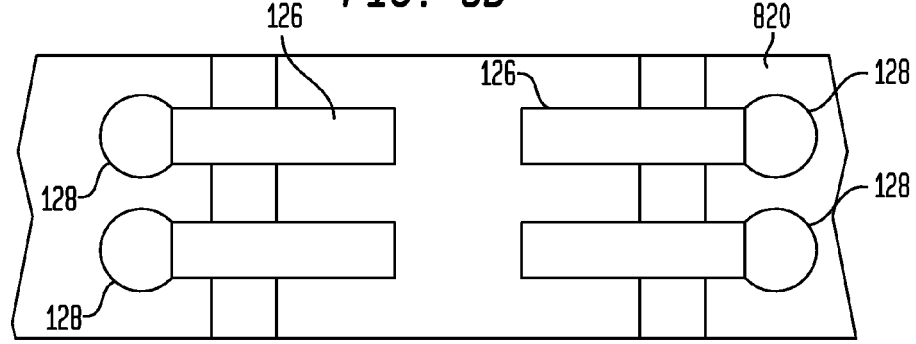

Next, referring to FIGS. 9A and 9B, the substrate is now prepared for processing which will form conductive traces 126 and lands 128. If prior processing results in the dielectric layer 820 obstructing the front contact pads 116 of the chips, laser drilling, mechanical milling or other appropriate techniques can be used at this stage to open the bottoms of the vias adjacent to the front contact pads. In addition, if any part of a preexisting dielectric layer 710 (FIG. 8A) of the chip remains in alignment with the contacts 116, such layer can be removed in this step. Such removal can be accomplished, for example, laser drilling, mechanical milling, or other suitable technique. Other possible removal techniques include various selective etching techniques which can be isotropic or anisotropic in nature. Anisotropic etch processes include reactive ion etch processes in which a stream of ions are directed towards surfaces to be etched. Reactive ion etch processes are generally less selective than isotropic etch processes such that surfaces at which ions strike at high angles of incidence are etched to a greater extent than surfaces which are oriented with the stream of ions. When a reactive ion etch process is used, desirably, a mask layer is desirably deposited to overlie the conformal dielectric coating 820 and openings are formed therein which are aligned with the vias 708. In such way, the etch process avoids removing portions of the dielectric coating 820 other than that which lies within the vias 708.

The conductive traces 126 and lands 128 are now formed to overlie the conformal dielectric coating 820. An exemplary method of forming the traces and lands involves depositing a metal layer to overlie the conformal dielectric coating 220. Alternatively, the deposition can be conducted while portions of those surfaces are protected by a masking layer. The metal layer preferably is deposited by sputtering a primary metal layer onto exposed surfaces of the assembly, or by electroless deposition. This step can be performed by blanket deposition onto the rear face, walls and lowered surface of the device wafer, for example. In one embodiment, the primary metal layer includes or consists essentially of aluminum. In another particular embodiment, the primary metal layer includes or consists essentially of copper. In yet another embodiment, the primary metal layer includes or consists essentially of titanium. One or more other exemplary metals can be used in a process to form the primary metal layer.

A photoimageable layer then is deposited to overlie the primary metal layer and a three-dimensional photolithographic patterning process is utilized to pattern the primary metal layer, such as the process described in U.S. Pat. No. 5,716,759 to Badehi, the disclosure of which is hereby incorporated by reference herein. Thereafter, remaining portions of the photoimageable layer are removed. As a result, individual conductive patterns are formed which correspond to the dimensions of conductive traces to be formed thereon. Following patterning of the primary metal layer into individual lines, the photoimageable layer is removed from the device wafer and an electroplating process is used to plate a secondary metal layer onto the primary metal layer to form individual conductive traces 126 extending from the front contact pads 116 along the walls 120 and onto the rear faces 114 of the semiconductor chips. The secondary metal may include nickel or other noble metal. In one embodiment, the electroplated second metal on the primary metal layer completes the conductive traces. Alternatively, an optional third metal layer such as gold, platinum or palladium may be plated onto the secondary metal for providing corrosion resistance to complete the conductive traces.

Subsequently, an exemplary process, an additional dielectric layer 230 is deposited to overlie each of the conductive traces 226 extending along the rear surface 114 and walls 120. Desirably, the additional dielectric layer 230 is deposited by an electrophoretic deposition process such as described above with reference to FIGS. 8A-B. A patterned mask layer including a photoresist, oxide mask, etc., is formed on the contacts 128. Thereafter, during the electrophoretic deposition process, the resulting dielectric layer 230 is avoided from being formed on contacts 128 by the patterned mask layer. The patterned mask layer then is removed to expose the contacts 128 within openings in the dielectric layer 230.

Alternatively, instead of depositing the dielectric layer 230 by electrophoretic deposition, the dielectric layer can be formed by spin-coating or spray coating a photoimageable dielectric such as an encapsulant or a solder mask material towards the rear face 114 and walls 120 of the device wafer to form a relatively uniformly thick coating. Thereafter, openings can be formed in the conformal dielectric layer 230 in registration with the contacts 128 by photolithographic process. One or more processes, e.g., heating etc. may be performed to cause the dielectric layer 230 to harden after the initial deposition of the photoimageable material.

Next, a wettable metal layer 132, e.g., an "under bump metallization" or ("UBM") is formed within the openings in the dielectric layer 230, the wettable layer being in contact with each of the contacts 128. In one exemplary process, a diffusion barrier layer, e.g., a conductive layer including titanium, tungsten, tantalum, or other similar metal is formed in contact with the contacts 128. Thereafter, a layer including a first wettable metal can be deposited to overlie the barrier layer, such layer including a metal such as nickel, copper or other metal which desirably includes a noble metal. For enhanced corrosion resistance, a layer of gold, usually very thin, e.g., 0.1 micron, can be deposited as a final layer of wettable metal. After forming the wettable metal layer, conductive bumps 134 can be formed in contact with the wettable metal layer over each contact. Conductive bumps can be formed which include a fusible metal such as a solder, tin or eutectic composition, or which include a conductive paste, e.g., solder-filled or silver-filled paste, among others. The conductive bumps can include one or more conductive materials. In a particular example, the conductive bumps can include one or more noble metals, for example, copper, nickel, etc. In one example, the conductive bumps may be formed by placing spheres including a fusible metal such as solder, tin or eutectic onto the wettable metal layer 232 and then heating the conductive bumps thereto to fuse them to the wettable metal layer 232.

Figure 10A:
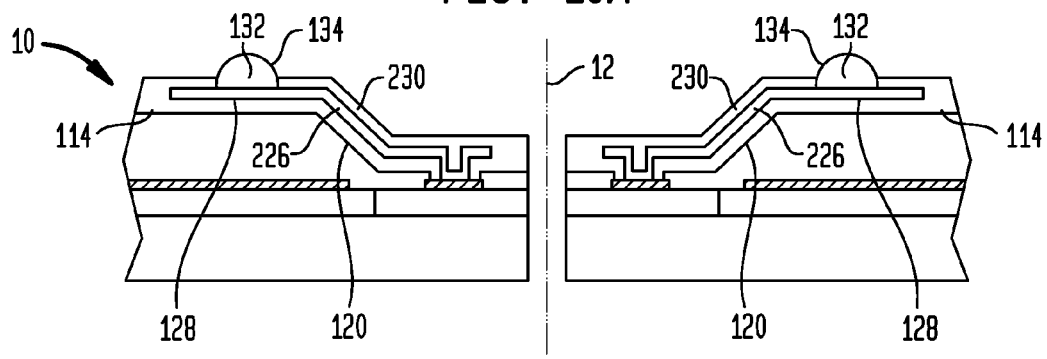
FIGS. 10A and 10B are a sectional view and a corresponding top-down plan view illustrating a stage of fabrication in accordance with an embodiment of the invention.
Figure 10B:
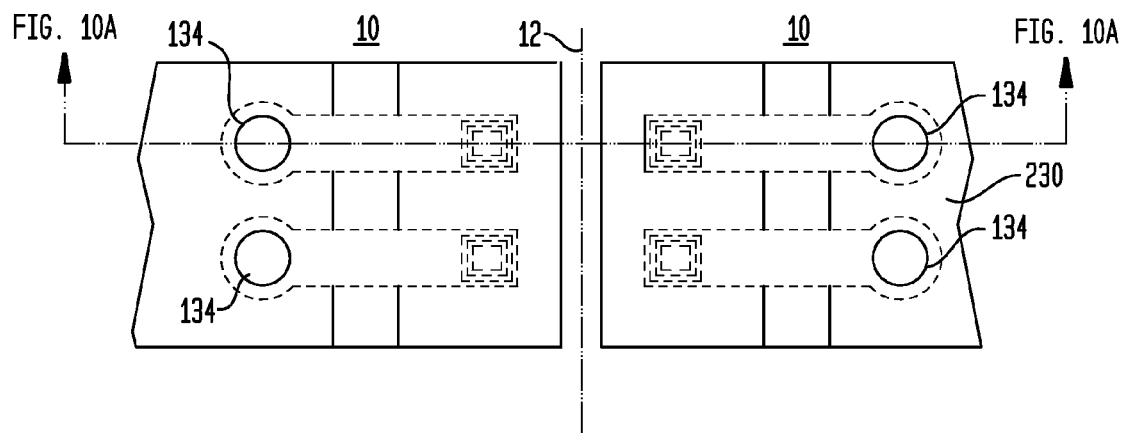

Finally, the packaged chips are severed from each other along dicing lane 12 by sawing or other dicing method to form individual packaged chips 10 as illustrated in FIGS. 10A-10B. A variety of exemplary processes for severing packaged chips into individual units are described in the herein incorporated commonly owned U.S. Provisional Application Nos. 60/761,171 and 60/775,086, any of which can be used to sever the packaged chips to form individual packaged chips as shown in FIGS. 10A-10B.

Figure 11:
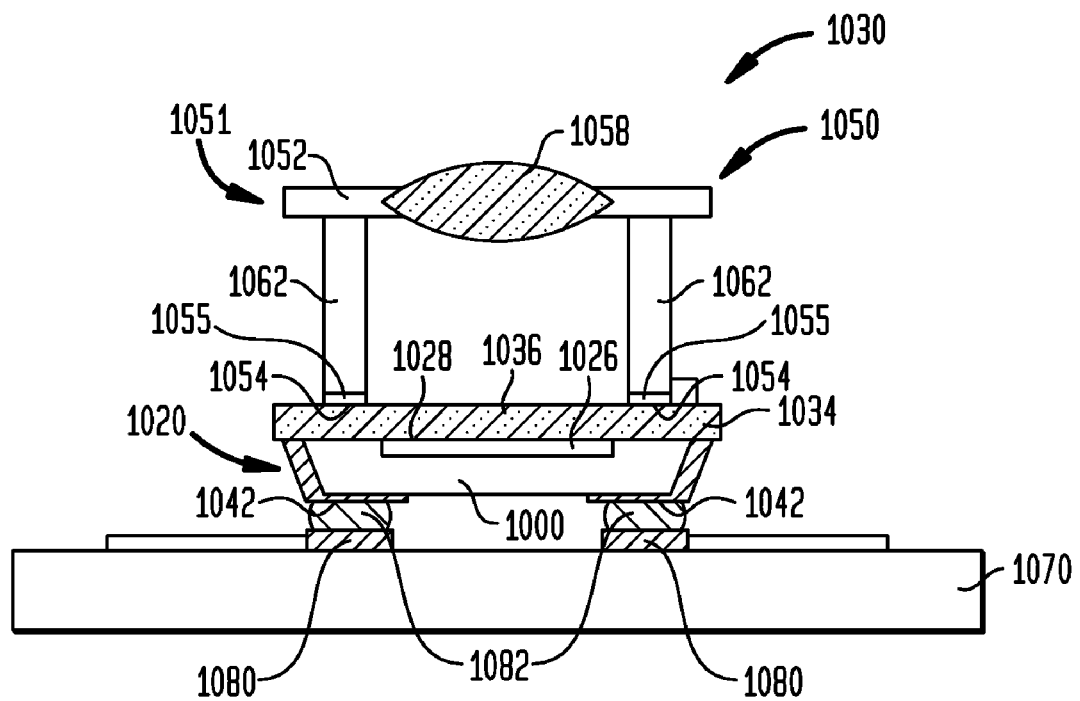
FIG. 11 is a sectional view illustrating an optoelectronic device module such as a camera module in accordance with an embodiment of the invention.

A camera module 1030 according to an embodiment of the invention (FIG. 11) includes a sensor unit 1020 having contacts 1042 disposed on the rear face of the sensor unit, i.e., on the surface of the semiconductor chip 1000 opposite from the front surface 1028 which carries the imaging area 1026. The sensor unit can be such as that shown and described above with reference to FIG. 1. Similar sensor units and camera modules are described in commonly owned U.S. patent application Ser. No. 11/265,727 filed Nov. 2, 2005 and Ser. No. 11/322,617 filed Dec. 30, 2005, further identified as the disclosures of which are hereby incorporated herein by reference. The contacts 1042 of the sensor unit are connected to terminals 1080 of a circuit panel 1070 by masses 1082 of fusible conductive material such as solder.

The optical unit 1050 in this arrangement includes a turret or support structure 1051 having a mounting portion 1052 arranged to hold one or more lenses or other optical elements 1058. The support structure 1051 also includes a plurality of rear elements 1062 in the form of elongated posts 1062 projecting rearward from the mounting portion 1052. These posts have rear surfaces 1054 which abut or mechanically engage a reference plane in the sensor unit to position the optical unit relative to the sensor unit. In the example illustrated in FIG. 11, the rear surfaces 1054 abut the front surface of the transparent cover 1034 which overlies the imaging area 1026. Alternatively, the turret or support structure includes registration features, e.g., posts, pins, recesses, or the like, for mechanically setting the height of the optical unit 1050 with respect to the chip 1000, while limiting tilt of the turret with respect to the imaging area 1026 of the chip.

It is desirable to make the connection between the rear surfaces of the posts 1062 and the front surface 1034 level and uniform in thickness. In another way to achieve this purpose, metallic attachment features or pads 1055 can be provided at the outer surface 1036 of the cover 1034, which are metallurgically bonded, e.g., via diffusion bonding, to metallic features at the rear surfaces 1054 of the posts 1062. Alternatively, a somewhat thin adhesive can be used to bond the rear surfaces of the posts to the cover.

In another embodiment, in place of posts, the turret or support structure 1051 includes a rear element which encloses or substantially encloses a volume having a cylindrical or polyhedral shape. Such rear element can be provided which has a cylindrical wall or polyhedral shaped (e.g., box-shaped) wall, in which the rear surface of the rear element abuts against a reference plane of the sensor unit such as provided at the outer surface 1036 of the cover 1034.

Figure 12:
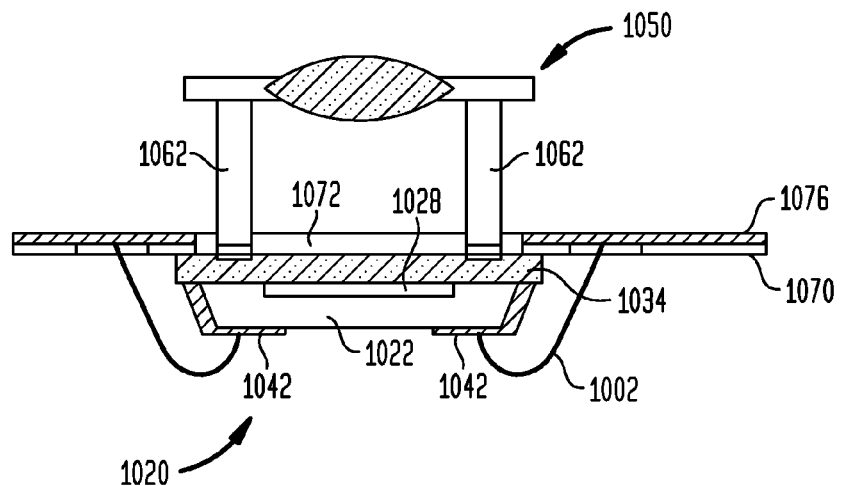
FIGS. 12 and 13 are a sectional view and a corresponding perspective view illustrating an alternative optoelectronic device module such as a camera module in accordance with an embodiment of the invention.

In a variation of the above embodiment shown in FIG. 12, sensor unit 1020 is mounted with the front of the sensor unit, and hence, imaging area 1028 facing forwardly, toward the rear or bottom surface of circuit panel 1070. The contacts 1042 of the sensor unit are connected by suitable leads or wire bonds 1002 to the conductors 1076 of the circuit panel. In this embodiment, the rear elements 1062 of the optical unit 1050 project through a hole 1072 in the circuit panel aligned with the imaging area 1028. Stated another way, hole 1072 is large enough to accommodate the light path from the optical element to the imaging area and also accommodate the rear elements 1062. A similar arrangement can be used with sensor units having contacts on the front face, as discussed above.

Figure 13:
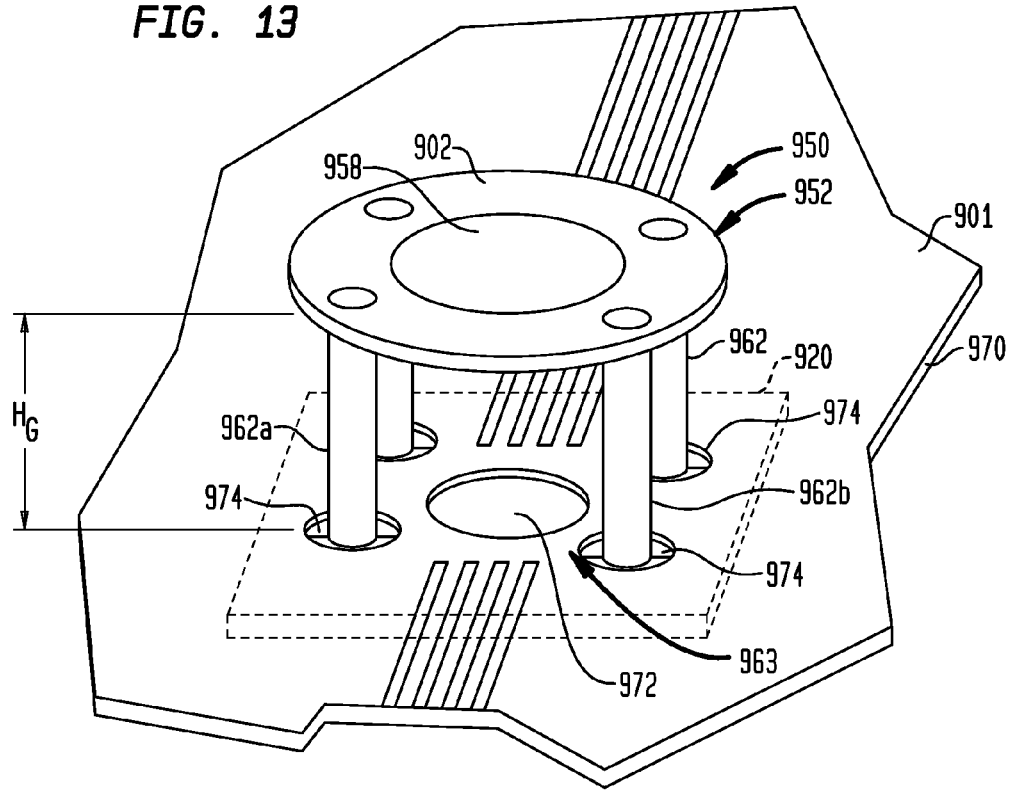

A camera module in accordance with a further embodiment of the invention (FIG. 13) includes a sensor unit 920, depicted in broken lines, disposed on the bottom or rear side of a circuit panel 970. Here again, the imaging area of the chip in the sensor unit is aligned with a hole 972 in the circuit panel. The optical unit 950 in this arrangement includes a turret or support structure 952 having a mounting portion 902 arranged to hold one or more lenses or other optical elements 958. The support structure 952 also includes a plurality of rear elements 962 in the form of elongated posts projecting rearward from the mounting portion 902. These posts extend through apertures 974 in the circuit panel, and thus mechanically engage the sensor unit to position the optical unit relative to the sensor unit as discussed above. Here again, posts define gaps between them as, for example, gap 963a between posts 962a and 962b. Here again, the circuit panel 970 may extend into the gaps, and hence may extend between the sensor unit and optical unit, which facilitates making connections to the sensor unit as discussed above. In the embodiment of FIG. 13, the gaps have substantial height. The height $H_G$ of the gap in the completed assembly is equal to the height of the mounting element 902 above the front surface 901 of circuit panel 970. The height $H_G$ desirably is on the order of 2 mm or more, more desirably 5 mm or more, and most preferably 1 cm or more. The width of each gap (i.e., the horizontal distance, parallel to the circuit panel, between rear elements 962a and 962b) desirably also is at least about 2 mm, more desirably at least about 5 mm, and most desirably at least about 1 cm. As further discussed below, provision of such large gaps allows access into the area between the optical element and hole 972 for performing operations on the completed assembly. The large gaps, however, can be provided without increasing the overall height of the assembly. The distance between the optical elements such as lens 958 and the sensor unit is set by the optical properties of the system as, for example, the focal length of lens 958. Therefore, the lens must be supported at a substantial distance forward of the circuit panel in any event.

A module or assembly in accordance with the embodiment of FIG. 13 can be treated after assembly by performing operations on the sensor unit through the gap or gaps, and desirably also through hole 972 in the circuit panel. For example, the assembly may be subjected to a cleaning operation in which a cleaning fluid, a cleaning implement, or both are inserted into one or more of the gaps and through hole 972 to clean the surface of the sensor module. For example, where the sensor module incorporates a cover facing forwardly toward the rear or bottom surface of the circuit panel, the area of the cover aligned with the hole which includes the area aligned with the imaging area of the sensor chip can be cleaned. The ability to perform such a cleaning operation on the completed assembly counteracts the effects of contamination during the assembly process. This, in turn, can provide a higher quality camera unit, and also can allow some relaxation of the conditions applied during assembly to provide contamination. For example, a "clean room" environment may be unnecessary, or alternatively, a less expensive, lower-quality clean room may be used. In a further example, the sensor unit may not incorporate a separate cover, but instead may consist only of a "bare" semiconductor chip having an imaging area and having a passivation layer in the form of a thin coating effective to protect the elements of the bare chip from chemical or mechanical damage during the assembly process. Such a bare imaging chip typically requires very stringent precautions during handling to avoid deposition of dirt overlying one or more imaging elements. The requirements are somewhat less stringent for sensor units which incorporate a cover. However, by post-cleaning after assembly, the less stringent requirements may be applied to assembly of sensor units which do not include a cover.

In a method according to a further embodiment of the invention, the sensor unit may include a sacrificial layer overlying the front of the sensor unit as, for example, a sacrificial layer overlying the outer surface of the cover in a sensor unit which includes a cover, or a sacrificial layer overlying the imaging area of the chip in a sensor unit which does not include a cover. The assembly is fabricated with the sacrificial layer in place. The completed assembly is then subjected to an operation in which the sacrificial layer, or at least that portion of the sacrificial layer aligned with the imaging area of the sensor unit, is removed through hole 972 and through the one or more of the gaps 963 in the support structure 952. For example, the sacrificial layer may be removed by dissolving it, or by mechanically engaging it and peeling it away from the sensor unit. Removal of the sacrificial layer removes any contaminants which may have accumulated on that layer.

Other operations also may be performed through the gap or gaps. For example, a tool may be inserted into the gap or gaps to engage the conductors of the circuit panel and bond them to the contacts of the sensor unit. Alternatively, a wire-bonding tool may be used to provide wire bonds extending between the conductors and the sensor unit through hole 972, or through one or more of the additional apertures 974, or through other apertures (not shown) provided in the circuit panel for this purpose.

It is not essential to provide post-like rear elements in order to provide large gaps as discussed above. For example, the rear elements may be in the form of plates or ribs. Also, it is not essential to provide multiple gaps; only one gap may be sufficient for some operations.

Figure 14:
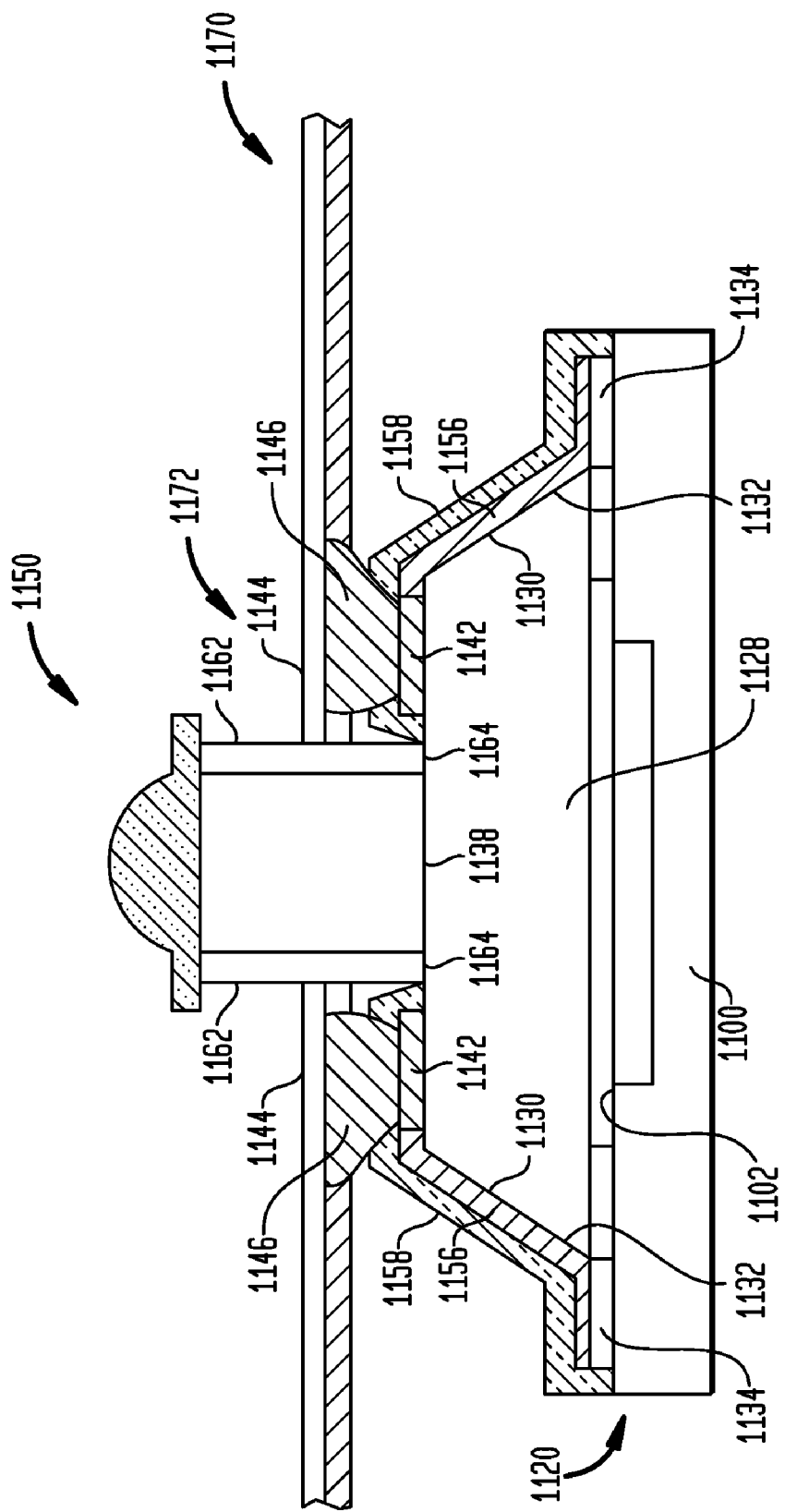
FIG. 14 is a sectional view illustrating yet another alternative optoelectronic device module such as a camera module in accordance with an embodiment of the invention.

FIG. 14 illustrates an optical unit or camera module in accordance with another embodiment of the invention. In this embodiment, a sensor unit 1120 has contacts 1142 conductively connected to terminals 1144 of a circuit panel which overlies the outer surface 1138 of the cover 1128, e.g., via solder masses 1146. Walls 1130 of the cover are preferably sloped such that the radii at edges 1132 of the walls are gradual and preferably provide a smooth transition between a set of first contacts 1134 provided on the front surface 1102 of the chip and the walls 1130. A set of conductive traces 1156 extend from the first contacts 1134 along walls 1130 and onto the outer surface 1138 of cover 1128, these being conductively connected to contacts 1142. A dielectric coating 1158, such as an epoxy or other polymeric material deposited preferably via electrophoretic deposition, overlies the conductive traces 1156 and is utilized as a passivation layer, e.g., solder mask with openings exposed above the contacts 1142.

As in the example shown and described above with reference to FIG. 12, an optical unit 1150 has a set of rear elements 1162 which extend rearward from a structure supporting an optical element 1158, e.g., a lens or other optical device selected from, among others, refractive or diffractive elements, filters, reflectors and scatterers. Here again, rear surfaces 1164 of the rear element are adapted to extend through a hole 1172 in the circuit panel to abut or engage the outer surface 1138 of the cover 1128 or other reference plane of the sensor unit 1120.

In the embodiments discussed above, the circuit panel has a hole extending through the panel in alignment with the imaging area of the sensor unit. Such a hole forms a transparent region in the circuit panel. In other embodiments, the circuit panel includes a solid but transparent region in alignment with the imaging area of the sensor unit. For example, the circuit panel may be formed from a transparent dielectric material, in which case the transparent region of the circuit panel may be provided simply by routing the conductors of the circuit panel so that no conductors cross the transparent region.

Figure 15:
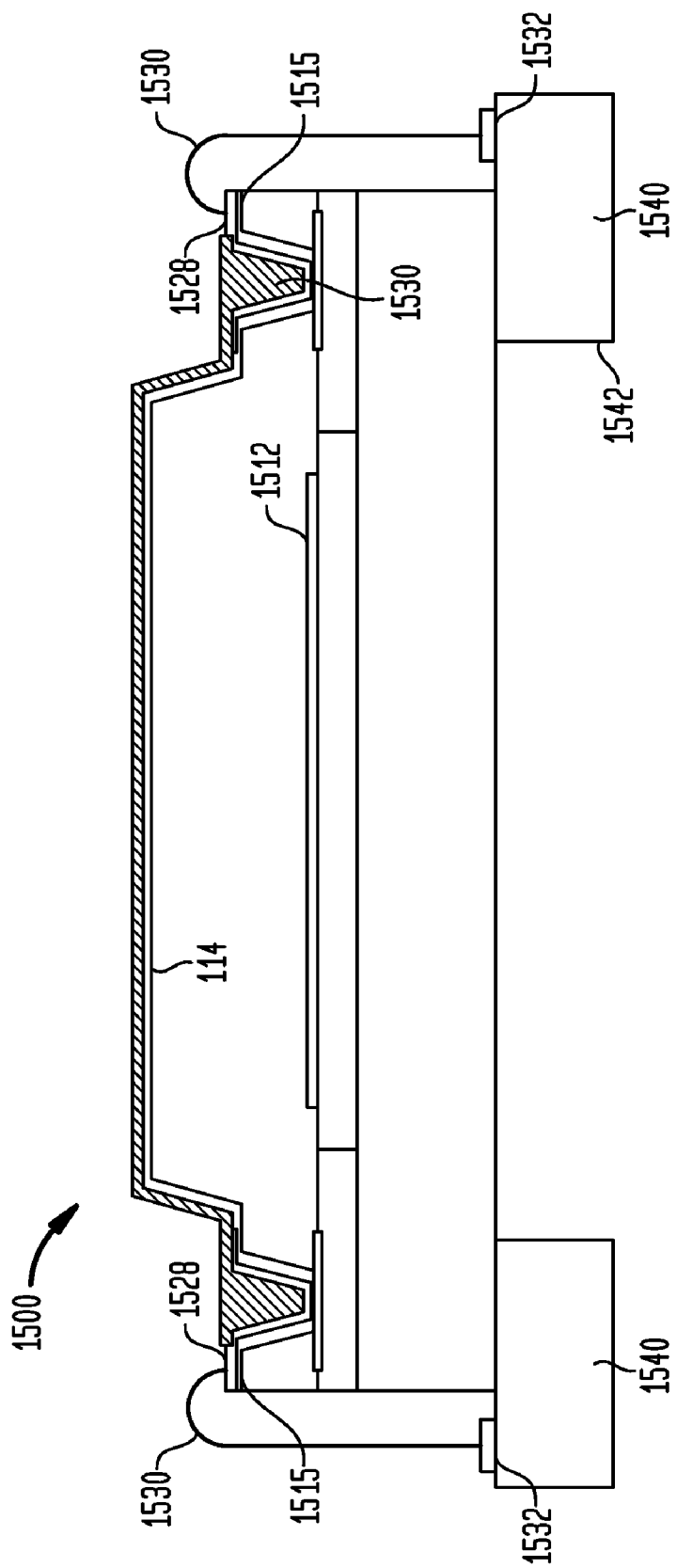
FIG. 15 is a sectional view illustrating an assembly including a packaged semiconductor chip in accordance with an embodiment of the invention.

FIG. 15 is a sectional view illustrating a packaged chip 1500 in accordance with a variation of the packaged chip (FIG. 1). As shown in FIG. 15, the external contacts 1528 of the chip are exposed at ledges 1515 of the chip defined by the lowered surfaces of the chip, the external contacts 1528 being disposed adjacent to edges 1502 of the semiconductor chip. Interconnection to external element such as a circuit panel can be made by forming bond wires 1530 connected to the external contacts 1528 at first ends and to terminals 1532 of a circuit panel 1540 at second ends, the circuit panel having an opening 1542 in registration with the optoelectronic element 1512, e.g., image sensor, of the chip. Alternatively, instead of bond wires, conductive masses, e.g., solder masses, solder balls, etc., can be used to interconnect the contacts 1528 to an external element disposed above the rear surface 114 of the chip.

FIG. 16A is a sectional view illustrating a packaged chip 1600 in accordance with a variation of the packaged chip (FIG. 1). In this embodiment, large openings 1604 in the chip 1602 extend through much of the thickness 1606 of the chip, and vias 1608 extend from within the large openings to the front conductive contacts 116. The large openings 1604 can be provided in form of holes overlying individual ones of the vias 1608, or alternatively, in form of channels extending over a row or rows of bond pads of each individual chip as shown in FIG. 6A, or in form of channels which extend the length of a wafer which includes the chips (FIG. 6B). Desirably, the thickness of the chip 1606 while it is in wafer form is reduced from its original thickness prior to performing steps to form the packaged chips shown in FIG. 16A. For example, a device wafer containing the chip can be thinned by grinding or lapping from the rear surface such that it has a thickness of about 200 microns before bonding the device wafer to a corresponding lid element. If the grinding is performed after bonding the wafer to the lid element, the thickness can be reduced even more, such as to a thickness of 50 microns, for example.

Figure 16B:
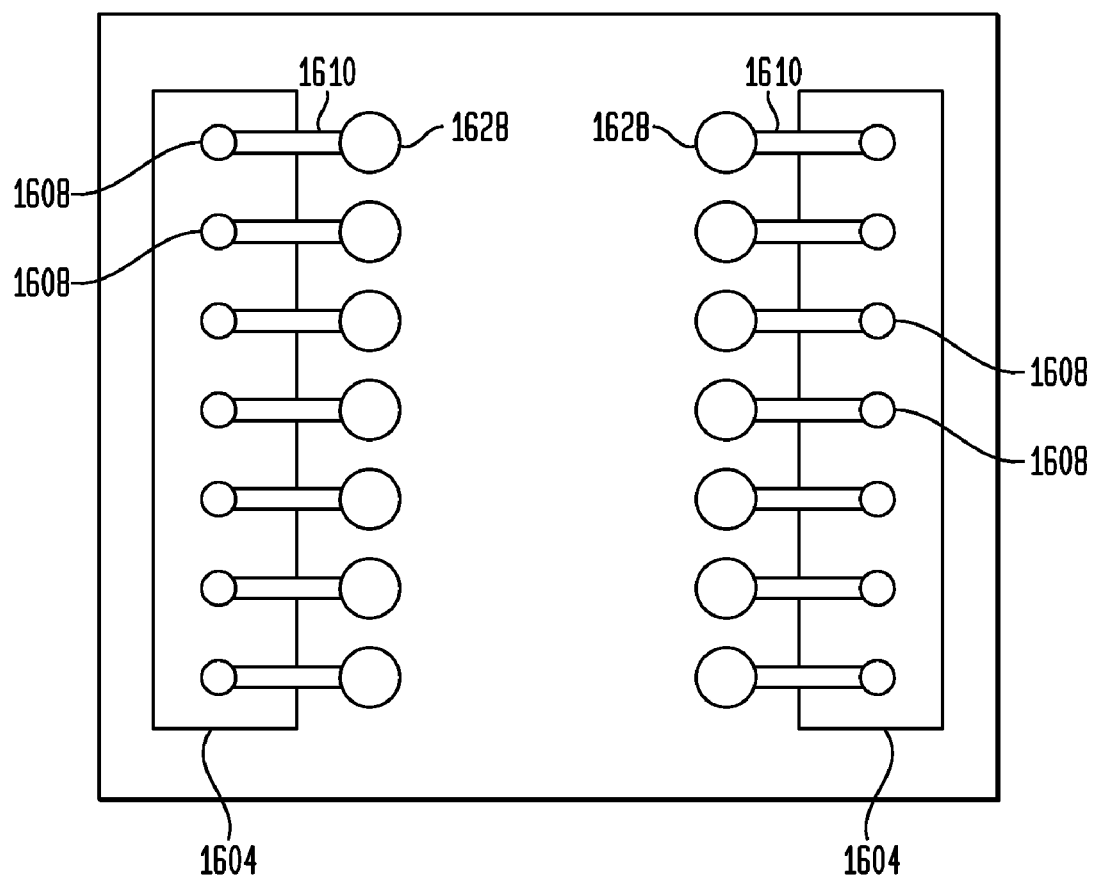
FIG. 16B is a plan view further illustrating the packaged chip shown in FIG. 16A.

In the example shown in FIG. 16A, conductive traces 1610 extend upwardly from bond pads 116 of the chip along walls of the vias 1608 and openings 1604. Alternatively, vias 1608 can be filled with conductive material. In such case, traces 1610 can extend from individual ones of the vias upwardly along a wall of an opening 1604 shared by several vias (See plan view (FIG. 16B) looking toward rear face). Traces 1610 are connected to external contacts 1628 at locations overlying the rear surface 1614 of the chip 1602. While FIGS. 1 and 15 through 24B show embodiments having either filled small vias 1908 (e.g., FIG. 19A) or traces extending along the vias (e.g., vias 1608), the alternative structures of the conductive vias are interchangeable in each case.

Alternatively, when each large opening 1604 has only one via within, the via 1608 and the large opening 1604 can be filled with a conductive material overlying a dielectric layer 1620 disposed on walls of the via 1608 and opening 1604.

Figure 17:
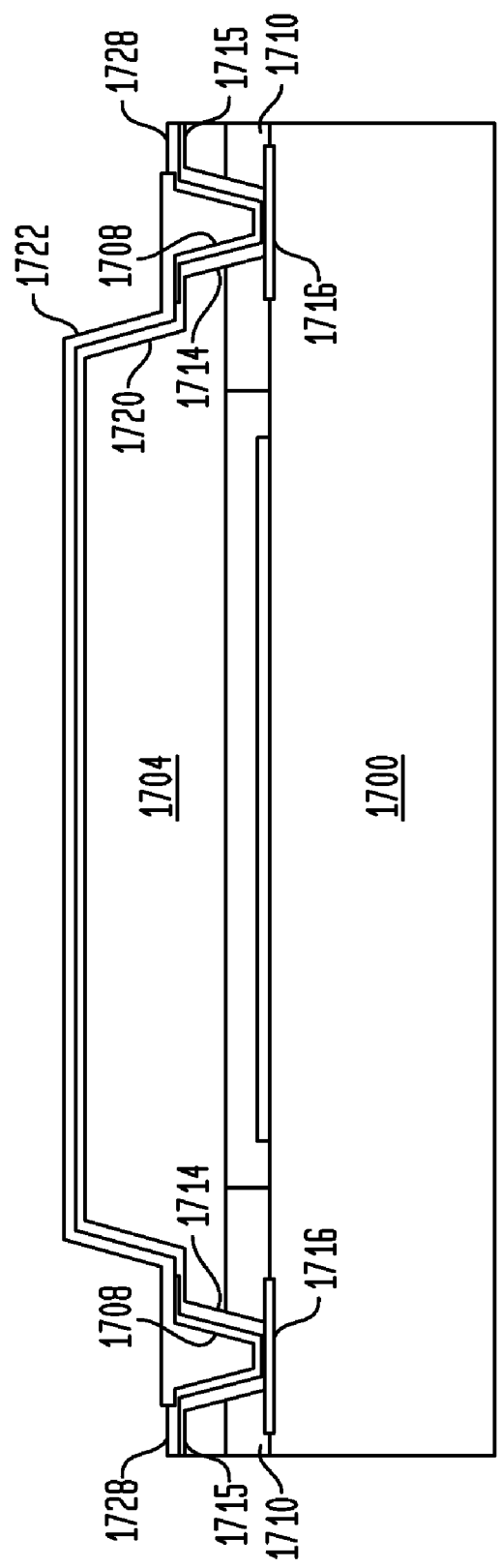
FIG. 17 is a sectional view illustrating a packaged chip in accordance with another embodiment of the invention.

FIG. 17 illustrates a packaged chip according to a variation of the embodiment shown and described above with reference to FIG. 15. This example varies from that shown in FIG. 15 in that the optically transmissive lid, rather than the chip, has ledges 1715 defined by lowered surfaces adjacent to its edges and contacts 1728 disposed on the ledges. FIG. 17 illustrates an embodiment in which one or more dielectric layers 1720, 1722, e.g., a spin-coated dielectric, solder mask, etc., may extend over a top surface of the lid. However, given that the lid 1704 typically has dielectric properties, such dielectric layer may not be necessary and can usually be omitted. As also shown in FIG. 17, an inner surface 1706 of the lid is spaced from the front surface 1702 of the chip by a support structure 1710. The vias desirably are formed after a lid wafer containing the lid is joined to a device wafer containing the chip 1700, with the support structure 1710 between the device wafer and the lid wafer. Various etching, milling, laser or mechanical drilling processes such as described above can be used to form holes 1714 in the lid and the support structure 1710 to expose the contacts 1716 after which the vias are metallized and the contacts 1728, traces, etc., are formed.

Figure 18:
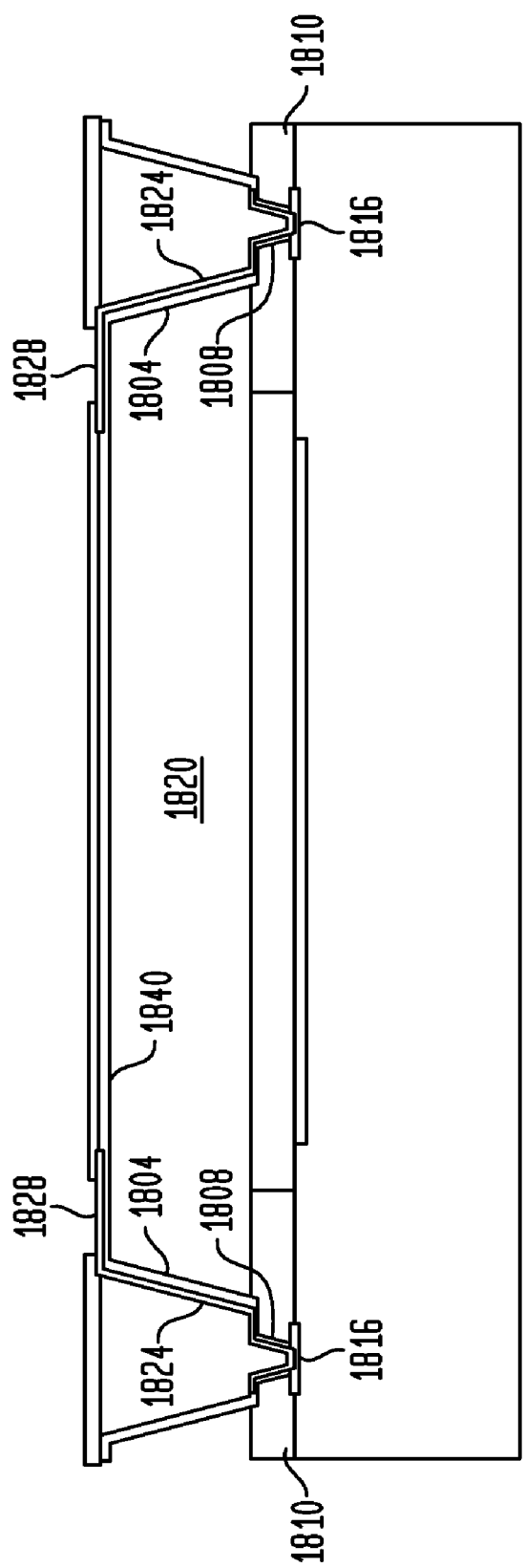
FIG. 18 is a sectional view illustrating a packaged chip in accordance with yet another embodiment of the invention.

FIG. 18 illustrates a packaged chip according to a variation of the embodiment shown in FIG. 17, which also has similarities with the embodiment shown in FIGS. 16A-B. In this embodiment, traces 1824 extending along walls of the large openings 1804 in the lid are connected at first ends to metallized vias 1808 and at second ends to external contacts 1828 overlying the top surface 1844 of the lid 1820. The vias extend through the support structure 1810 to the conductive contacts 1816 of the chip. Electrical interconnection to an external element can be provided through bond wires attached to the external contacts 1828 or by way of solder masses, e.g., solder balls, bumps, etc.

Figure 19B:
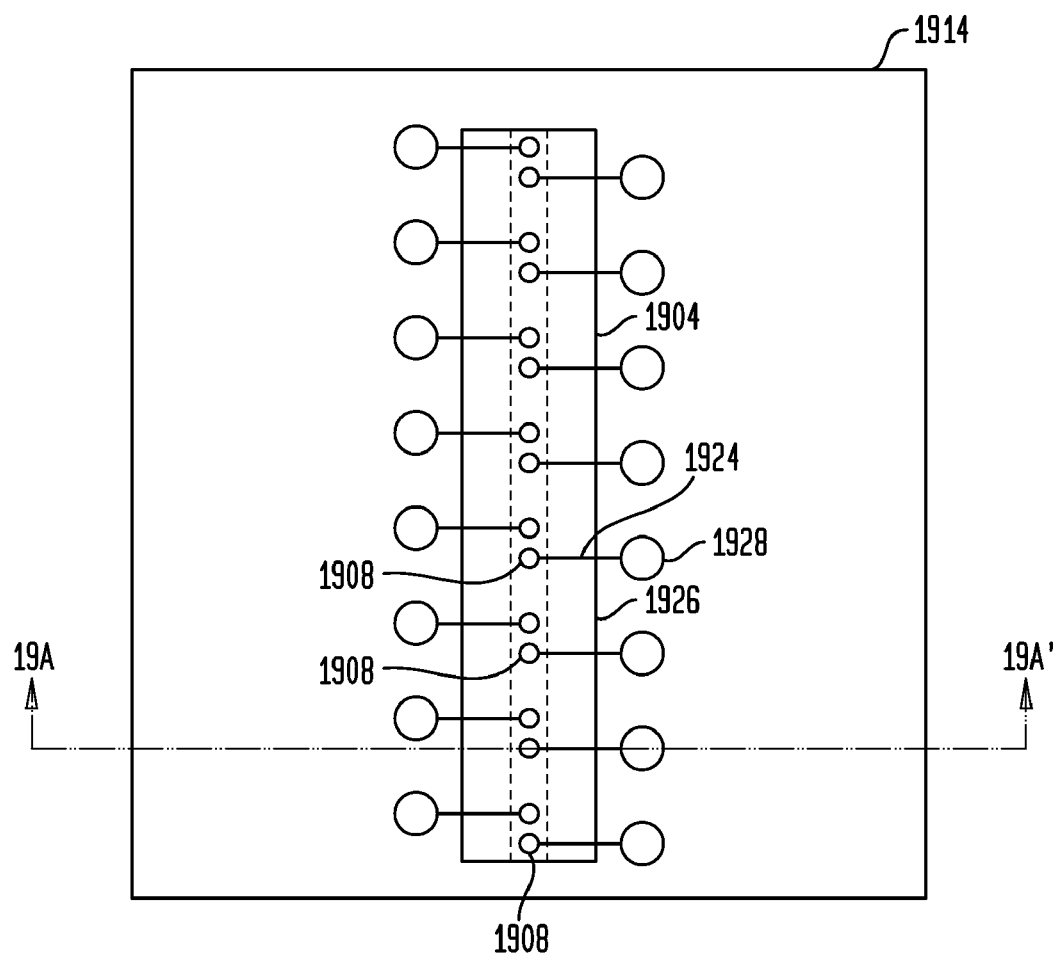
FIG. 19B is a corresponding plan view further illustrating a packaged chip in accordance with the embodiment of the invention shown in FIG. 19A.
Figure 19C:
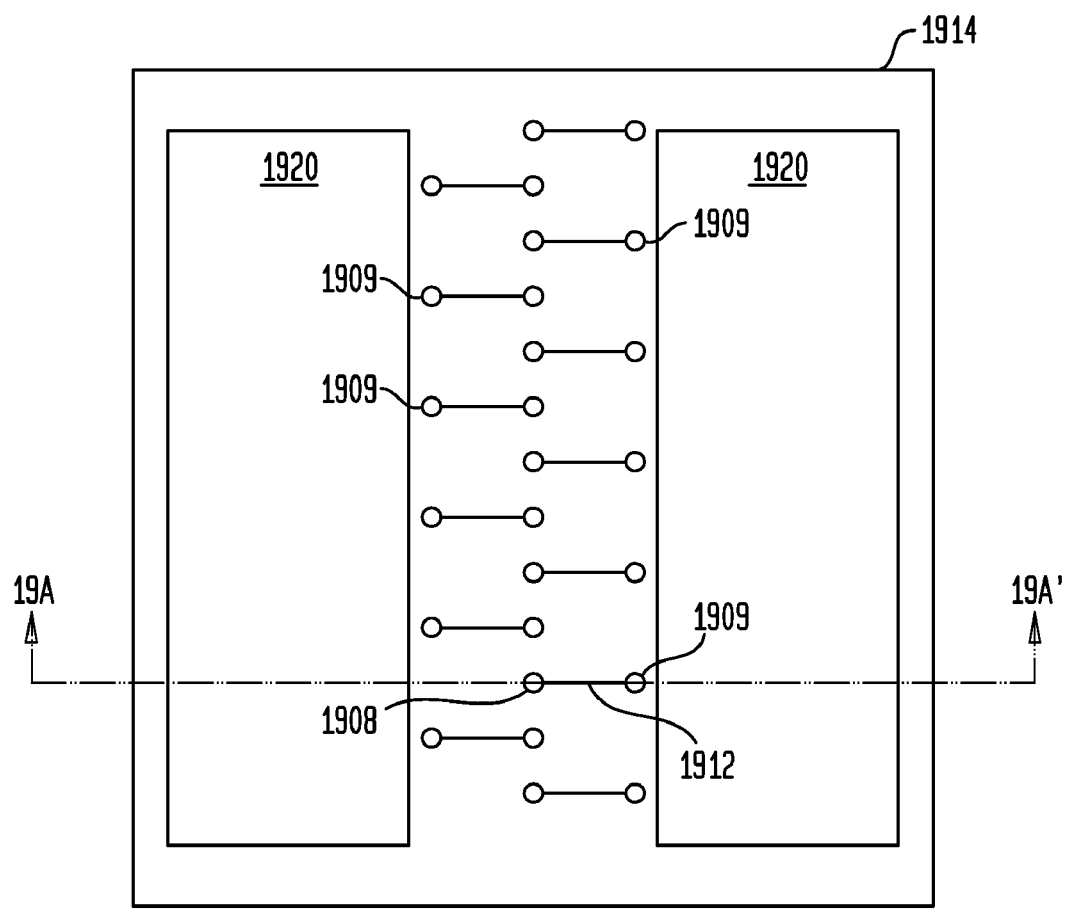
FIG. 19C is a corresponding plan view further illustrating a packaged chip in accordance with a variation of the embodiment of the invention shown in FIG. 19A.

FIG. 19A is a sectional view illustrating a stackable chip-scale packaged chip 1910 in accordance with another embodiment of the invention. The packaged chip may include a particular type of microelectronic device, such as a dynamic random access memory ("DRAM"). The packaged chip 1910 has similar features to the packaged chip 1600 (FIG. 16A) described above, in that conductive vias 1908 extending inwardly from the front face 1902 of the chip 1901 connect to traces 1924 extending along walls of a large opening in the rear face 1914 of the chip. However, the packaged chip 1900 does not include a lid overlying the front face, and the conductive vias 1908 are connected to bond pads 1909 by way of redistribution traces 1912 extending along the front face of the chip 1901. FIG. 19B is a corresponding plan view looking towards a rear face 1914 of the packaged chip. The view in FIG. 19A is taken along line 19A-19A' of FIG. 19B. As illustrated in FIG. 19B, traces 1924 extend from vias 1908 upwardly along walls 1926 of the large opening 1904 and onto rear surface 1914. The traces 1924 connect to external contacts 1928 which overlie the rear face 1914 of the chip. Referring to FIG. 19C, a plan view is provided looking towards the front face of the chip 1901, the chip including a DRAM, for example. In DRAMS, bond pads 1909 are typically provided in rows between memory circuits 1920. FIG. 19A is a view taken through line 19A-19A' of FIG. 19C. Redistribution traces 1912 on the front face 1902 connect the bond pads 1909 to the conductive vias 1908. The traces can be arranged as shown in FIGS. 19B, 19C such that some traces extend in a first direction away from the conductive vias and other traces extend in a second direction away from the vias, where the second direction is opposite the first direction. In this way, bond pads to the left side of the conductive vias are connected to some conductive vias and bond pads to the right side of the conductive vias are connected to other conductive vias.

Referring again to FIG. 19A, the conductive vias 1908 are tapered such that they become smaller in a direction from the front face 1902 towards the rear face 1914 of the chip. The conductive vias are insulated from the semiconductor material of the chip by a dielectric layer 1922. A passivation layer 1924 overlies the front face 1902 of the chip including the conductive vias 1908. Openings 1934 in the dielectric layer expose contacts 1936 at the front face of the chip. Desirably, the front face contacts 1936 are not in registration with the bond pads 1909, although they can be.

A dielectric fill material 1940 desirably overlies the traces 1924 within the large opening 1904 for providing electrical isolation between traces as well as mechanical support to the packaged chip 1901. Desirably, a dielectric layer 1942, e.g., a solder mask, overlies the traces 1924. Openings 1944 in the dielectric layer expose rear face contacts 1946 of the chip.

By providing both front face contacts 1936 and rear face contacts 1946, several packaged chips can be stacked one on top of the other to form a stacked assembly 1950 of packaged chips (FIG. 19D). In such arrangement, the front face contacts are aligned with the rear face contacts. Connection between respective adjacent ones of the packaged chips in the stacked assembly is through conductive masses. The dielectric layer 1930 on the front face and the dielectric layer 1942 on the rear face provide electrical isolation between adjacent packaged chips 1910 in the assembly except where interconnection is provided.

An advantage of the stacked assembly 1950 is that the front face and rear face contacts are offset from the large openings 1904 in the packaged chip. Therefore, pressure exerted upon the stacked assembly when interconnecting the packaged chips is felt primarily at those contacts at locations away from the large openings. Such arrangement helps to avoid applying pressure to the packaged chip at the large opening where the semiconductor chip may possibly be weakened by the removal of semiconductor material to form the large opening.

One potential benefit of having offset contacts is the ability to provide redistribution traces between the actual bond pads of the chip and the front and rear face contacts. Chip select features of certain types of memories, e.g., DRAMs, may require that certain bond pads of chips not be connected to the bond pads of other chips which directly overlie them.

FIG. 19E is a sectional view illustrating a variation of the embodiment illustrated in FIGS. 19A-19C. In this case, rear face contacts 1946' are exposed at the rear face at both a left side and a right side of the large opening 1904. Likewise, front face contacts 1936' are exposed at the front face at both a left side and a right side of the opening 1904. Traces 1926' connect the two rear face contacts 1946' to the same conductive via 1908. FIG. 19F is a sectional view illustrating a corresponding stacked assembly in which conductive masses 1952' join the front face contacts on respective left and right sides of the large opening to the rear face contacts on respective left and right sides of the large opening. Another possible benefit of the arrangement shown in FIGS. 19E-F is reduced inductance between packaged chips, because current flowing between adjacent chips now flows through a set of both left and right contacts per each signal.

Figure 20A:
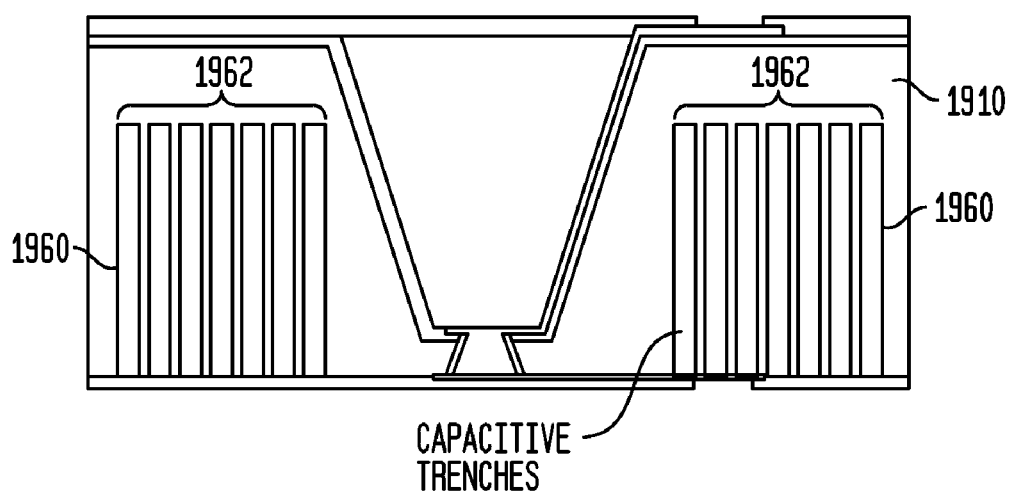
FIG. 20A is a sectional view illustrating a packaged chip in accordance with a variation of the embodiment shown in FIG. 19A.
Figure 20B:
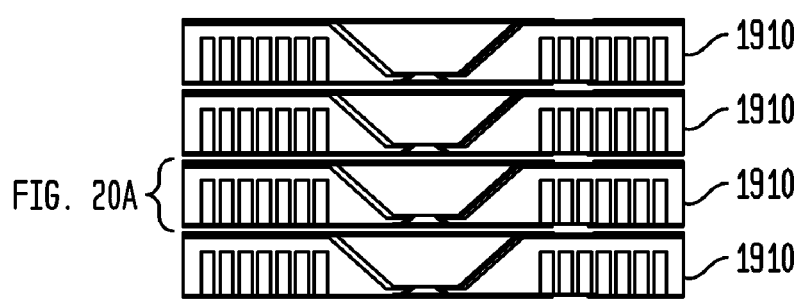
FIG. 20B is a sectional view illustrating a stacked assembly including a plurality of the packaged chips as shown in FIG. 20A.

FIG. 20A is a sectional view illustrating an advantage of the stackable packaged chip 1910 when the chip includes a DRAM. Certain types of semiconductor chips including DRAMS include capacitors formed in high aspect ratio trenches 1960 that extend downwardly from the front face of the chip. Often, the bond pads of the chip are disposed in close proximity to an array 1962 of such trench capacitors. In the packaged chip 1910, interconnection between the front face contacts and the rear face contacts is through a large opening which is at some distance from the trench capacitor arrays 1962. Referring to FIG. 20B, interconnection between adjacent chips 1910 in the stack can be provided using interconnects extending through the chip which do not interfere with the placement or function of the trench capacitor arrays.

Figure 21A:
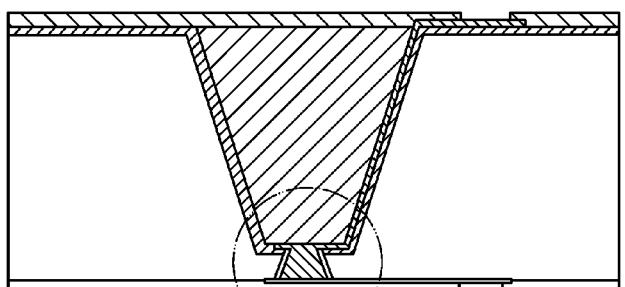
FIG. 21A is a sectional view further illustrating a packaged chip in accordance with an embodiment of the invention.
Figure 21B:
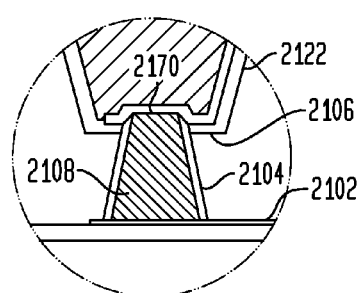
FIG. 21B is an enlarged detailed view further illustrating the packaged chip shown in FIG. 21A.

Interconnection between the conductive vias and traces in the large opening can be achieved in different ways. FIG. 21A illustrates one example interconnection. As illustrated in the magnified view in FIG. 21B, a conductive via 2108, formed to extend downwardly from the front face 2102 of the chip is filled with a metal. For example, after etching a hole from the front surface, a relatively thin layer of metal can be sputtered to cover the walls and bottom of the hole. Thereafter, electroplating can be used to form the metal filling. As illustrated in FIG. 21B, the large opening 2104 is formed by chemical etching, for example, which selectively etches the semiconductor material while preserving the metal of which the conductive via is formed. A result of over-etching the opening 2104 is to fully expose a top surface 2170 of the conductive via. Thereafter, the dielectric layer 2122 is formed and then an opening is made in the dielectric layer overlying the via 2108, such as by use of a laser. The laser can selectively remove the dielectric layer from over the top surface of the via because it is in a different focal plane from that of the dielectric layer which overlies the bottom 2106 of the large opening. Subsequently, when the conductive trace 2124 is formed, the trace contacts the entire top surface 2170 of the via 2108.

Figure 22A:
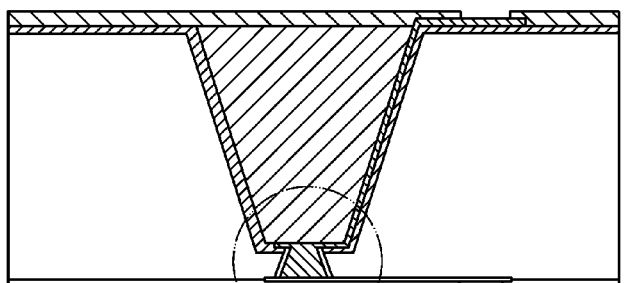
FIG. 22A is a sectional view further illustrating a packaged chip in accordance with an embodiment of the invention.
Figure 22B:
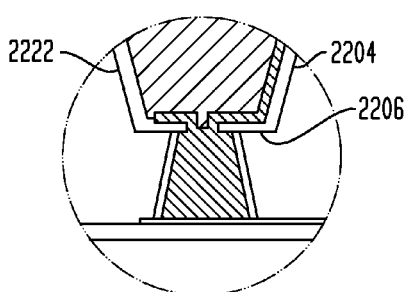
FIG. 22B is an enlarged detailed view further illustrating the packaged chip shown in FIG. 22A.

FIG. 22A illustrates another example interconnection. As illustrated in the magnified view in FIG. 22B, the large opening 2204 is formed by sawing after forming the conductive via. Then, after the dielectric layer 2222 is formed, an opening is made in the dielectric layer, such as through use of a laser. In this example, the laser opening is restricted in size in order to avoid forming openings where the dielectric layer contacts the semiconductor material in the bottom of the opening 2206.

Figure 23A:
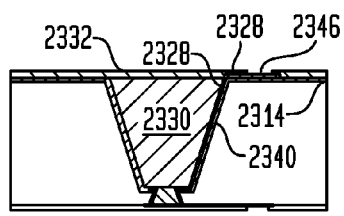
FIGS. 23A, 23B and 23C are sectional views illustrating packaged chips showing variations in accordance with embodiments of the invention.
Figure 23B:
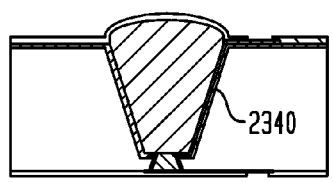
Figure 23C:
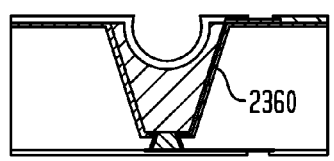

FIGS. 23A through 23F are sectional views illustrating various alternatives for filling the large openings of the chip after forming conductive traces therein. As illustrated in FIG. 23A, after forming the conductive trace, a flowable dielectric fill material 2330 is deposited or dispensed into the large opening or onto a rear face of the chip. The flowable dielectric material is caused to be distributed into the opening, e.g., as by spin-coating or heat treatment such that the fill material fills the opening 2304 and provides a surface approximately even with the rear face 2314. A solder mask 2332 then is deposited to overlie the fill 2330 and the trace 2328, an opening in the solder mask exposing a rear face contact 2346. FIG. 23B illustrates an alternative in which the fill material 2340 has greater volume than the large opening, such that the fill 2340 protrudes above the rear face 2304. Alternatively, when the fill 2340 is not evenly distributed, the fill may protrude above the rear face 2314. FIG. 23C illustrates another example when the volume of the fill 2350 is less than the volume of the opening 2304 or when the fill 2350 is not evenly distributed.

Figure 23D:
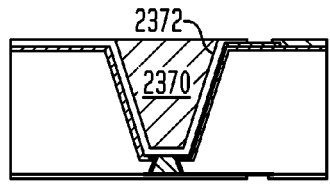
FIGS. 23D, 23E and 23F are sectional views illustrating packaged chips showing variations in accordance with embodiments of the invention.
Figure 23E:
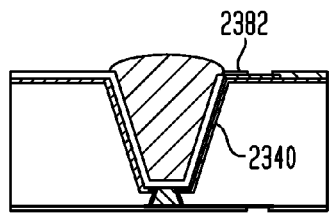
Figure 23F:
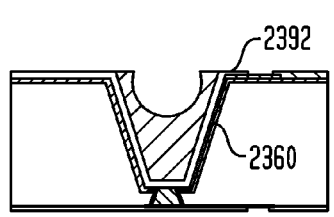

FIG. 23D illustrates another alternative similar to that shown in FIG. 23A, but in which the solder mask layer 2372 is deposited prior to depositing the fill material 2370. FIG. 23E illustrates an example similar to that shown in FIG. 23B, but in which the solder mask layer 2382 is deposited prior to depositing the fill material 2380. Finally, FIG. 23F illustrates an example similar to that shown in FIG. 23C, but in which the solder mask layer 2392 is deposited prior to depositing the fill material 2390.

Figure 24A:
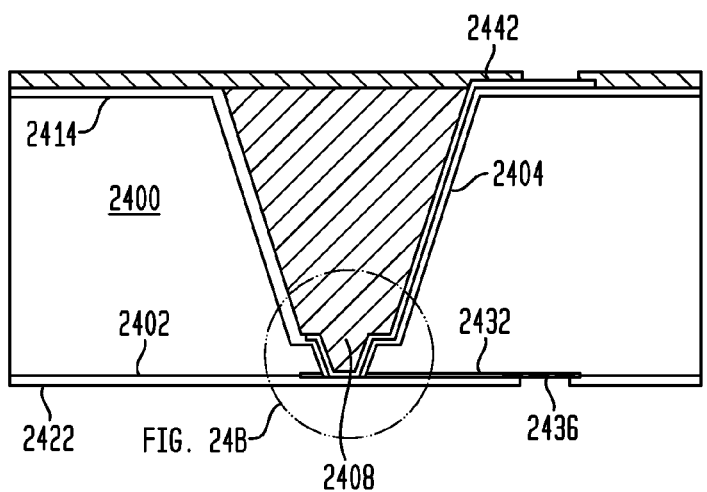
FIG. 24A is a sectional view further illustrating a packaged chip in accordance with an embodiment of the invention.
Figure 24B:
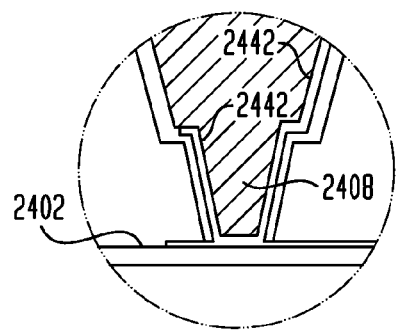
FIG. 24B is an enlarged detailed view further illustrating the packaged chip shown in FIG. 24A.

FIG. 24A is a sectional view illustrating a variation of the packaged chip illustrated in FIGS. 19A through 19C. FIG. 24B is a magnified view showing the conductive via 2408 thereof. In this variation, the conductive via 2408 is formed from processes applied through the large opening in a direction towards the front face 2402 of the chip. In this case, processing is similar to that described above with reference to FIGS. 16A-B above. During fabrication, the device wafer including the chip 2400 can be temporarily mounted front face down onto a carrier wafer (not shown) after forming front face contacts 2436, traces 2432 and dielectric layer 2422 on the front face. After forming the large opening, holes can be formed for the vias from within the large opening, such as by laser drilling, etching, mechanical milling, etc. When the holes are formed, the carrier wafer can provide mechanical support to the conductive trace 2402 to help keep it in place at the bottom of the hole. Subsequently, the via and the large opening can be metallized by simultaneous processing to form the conductive trace 2442 extending within the via, the large opening and onto the rear face 2414.

In another variation of the packaged chip 1910 described above with reference to FIGS. 19A-C, FIG. 25A illustrates a chip 2510 having exposed chip-to-chip interconnects in form of solder balls 2550. In this embodiment, a solder ball 2550 is joined to a top surface of the conductive via 2508 within the large opening 2504. The conductive via may be conductively connected to a bond pad 2509 or other contact on the front face 2502 of the chip 2510, such as by way of a conductive trace. A passivation layer 2522 overlies the conductive trace 2512 and bond pad 2509, the passivation layer 2522 having an opening in registration with the conductive via 2508. FIG. 25B illustrates a stacked assembly including a plurality of the chips 2510 illustrated in FIG. 25A, each chip being interconnected to the next adjacent chip by way of the solder ball 2550 between them.

Figure 25A:
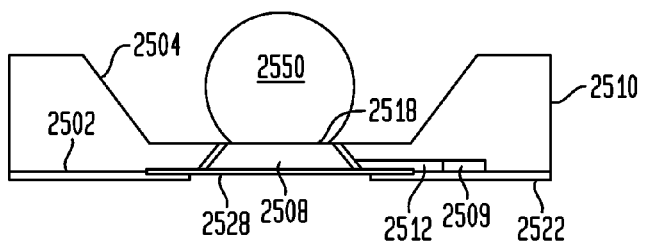
FIG. 25A is a sectional view illustrating a packaged chip in accordance with an embodiment of the invention.
Figure 26A:
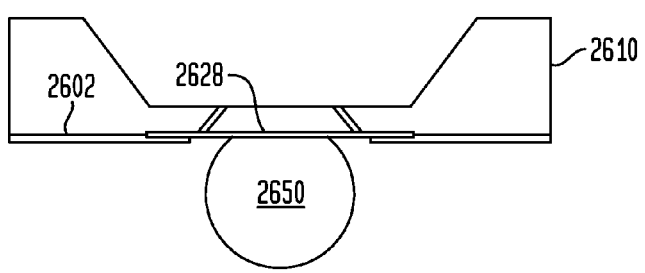
FIG. 26A is a sectional view illustrating a packaged chip in accordance with an embodiment of the invention.
Figure 26B:
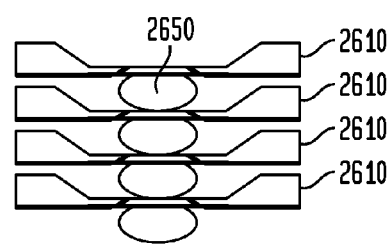
FIG. 26B is a sectional view illustrating a stacked assembly including a plurality of the packaged chips as shown in FIG. 26A.

FIG. 26A illustrates a variation of the embodiment shown in FIG. 25A in which a solder ball 2650 is joined to a bottom surface 2528 of the conductive via 2608 such that it protrudes downwardly below the front face 2602 of the chip. FIG. 26B illustrates a stacked assembly including a plurality of the chips 2610 as conductively joined together by way of the solder balls 2650 between adjacent chips 2610.

Figure 25B:
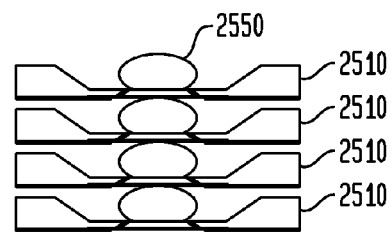
FIG. 25B is a sectional view illustrating a stacked assembly including a plurality of the packaged chips as shown in FIG. 25A.
Figure 27A:
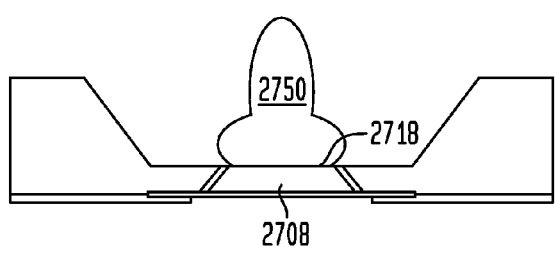
FIG. 27A is a sectional view illustrating a packaged chip in accordance with an embodiment of the invention.
Figure 27B:
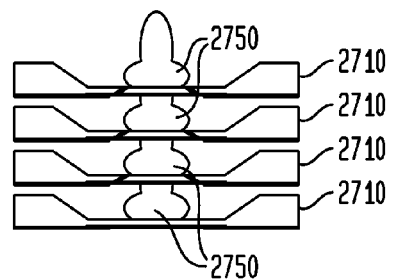
FIG. 27B is a sectional view illustrating a stacked assembly including a plurality of the packaged chips as shown in FIG. 27A.

FIG. 27A illustrates another variation of the embodiment shown in FIG. 25A in which a stud bump 2750, e.g., consisting essentially of gold or other metal, is joined to the top surface 2718 of the conductive via 2708. FIG. 27B illustrates a corresponding stacked assembly, wherein the stud bumps 2750 conductively interconnect adjacent ones of the chips.

Figure 28A:
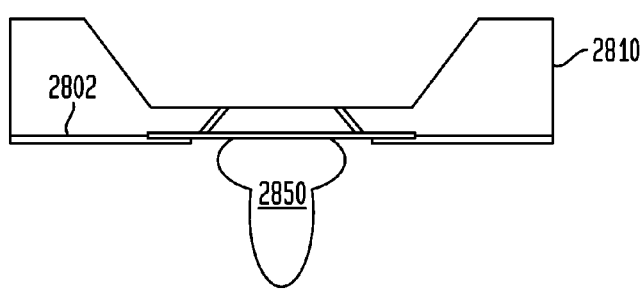
FIG. 28A is a sectional view illustrating a packaged chip in accordance with an embodiment of the invention.
Figure 28B:
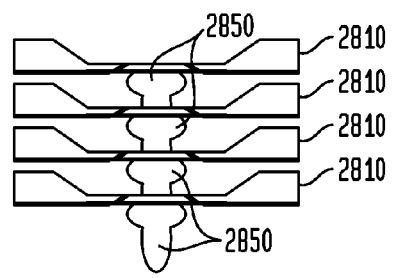
FIG. 28B is a sectional view illustrating a stacked assembly including a plurality of the packaged chips as shown in FIG. 28A.

FIG. 28A illustrates yet another variation, similar to that shown in FIG. 26A, in which the stud bump is joined to a bottom surface of the conductive via such that the stud bump protrudes downwardly from the front face 2802 of the chip. FIG. 28B illustrates a corresponding stacked assembly in which chips 2810 as shown in FIG. 28A are conductively interconnected by the stud bumps 2850.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

For example, in a particular embodiment of the invention, conductive traces extend from conductive features at the front face of a semiconductor chip along edges of a lid or along walls of openings formed in a lid covering the semiconductor chip and onto an outer surface of the cover element.

The invention claimed is:

1. A microelectronic unit, comprising:
a semiconductor chip having a front surface and a rear surface remote from the front surface, a microelectronic device having an active semiconductor region in a region of semiconductor material below the front surface, a plurality of conductive pads each having a top surface exposed at the front surface and having a bottom surface remote from the top surface, the semiconductor chip having a first opening extending from the rear surface partially through the semiconductor material region towards the front surface, and a second opening meeting the first opening within the semiconductor material region and extending to a pad of the plurality of pads;
a conductive via in registration with and in contact with the pad and extending within the second opening;
a conductive interconnect electrically connected to the conductive via and extending away therefrom at least partly within the first opening;
a conductive contact electrically connected to the conductive interconnect, the contact available for connection with an element external to the microelectronic unit,
wherein the first opening has a first width in a lateral direction along the rear surface, the second opening has a second width in the lateral direction where the second opening meets the first opening, and the second opening has a third width in the lateral direction adjacent the conductive pad, the first width being greater than the second width, and the second width being greater than the third width.

2. A microelectronic unit as claimed in claim 1, wherein the second opening is tapered to become smaller in a direction towards the conductive pad.

3. A microelectronic unit, comprising:
a semiconductor chip having a front surface and a rear surface remote from the front surface, a microelectronic device having an active semiconductor region in a region of semiconductor material below the front surface, a plurality of conductive elements each having a top surface exposed at the front surface and having a bottom surface remote from the top surface, the semiconductor chip having a first opening extending from the rear surface partially through the semiconductor material region towards the front surface, and a second opening meeting the first opening within the semiconductor material region and extending to at least a bottom surface of a conductive element of the plurality of conductive elements;
a conductive via in contact with the conductive element and extending within the second opening;
a conductive interconnect electrically connected to the conductive via and extending away therefrom at least partly within the first opening;
a conductive contact electrically connected to the conductive interconnect, the contact available for connection with an element external to the microelectronic unit,
wherein the first opening has a first width in a lateral direction along the rear surface, the second opening has a second width in the lateral direction where the second opening meets the first opening, and the second opening has a third width in the lateral direction adjacent the conductive element, the first and third widths being greater than the second width.

4. A microelectronic unit as claimed in claim 3, wherein the second opening is tapered to become smaller in a direction towards the first opening.

5. A microelectronic unit as claimed in claim 1, further comprising a first dielectric layer contacting an interior surface of the first opening, wherein a portion of the first dielectric layer extends along a surface of a second dielectric layer adjacent the conductive pad.

6. A microelectronic element as claimed in claim 1 or claim 3, wherein a plurality of the second openings meet the first opening, the microelectronic unit having a plurality of the conductive vias extending from respective ones of the conductive pads or conductive elements, and a plurality of the conductive interconnects extending away from the conductive vias, wherein a dielectric layer insulates respective ones of at least some of the conductive interconnects.

7. A microelectronic element as claimed in claim 1 or claim 3, wherein the conductive via includes a conductive coating having a contour conforming to a contour of an interior surface of the second opening.

8. A microelectronic unit as claimed in claim 7, further including a dielectric layer overlying the conductive coating within the second opening.

9. A microelectronic element as claimed in claim 1 or claim 3, wherein the conductive via is insulated from a surface of the semiconductor material region exposed within the second opening by a dielectric layer, the conductive via including a conductive material filling a volume within the second opening bounded by the dielectric layer.

10. A microelectronic unit as claimed in claim 9, wherein the conductive interconnect includes a conductive feature within the first opening which has a contour conforming to a contour of an interior surface of the first opening.

11. A microelectronic unit as claimed in claim 1 or claim 3, wherein the conductive interconnect is insulated from a surface of the semiconductor material region exposed within the first opening by a dielectric layer, the conductive interconnect including a conductive material filling a volume within the first opening bounded by the dielectric layer.

12. A microelectronic unit as claimed in claim 11, wherein the conductive via has a contour conforming to a contour of an interior surface of the second opening.

13. A microelectronic element as claimed in claim 11, wherein the conductive via is insulated from a surface of the semiconductor material region exposed within the second opening by a dielectric layer, the conductive via including a conductive material filling a volume within the second opening bounded by the dielectric layer.

14. A microelectronic unit, comprising:
a semiconductor chip having a front surface and a rear surface remote from the front surface, a microelectronic device including an active semiconductor region in a region of semiconductor material below the front surface, a plurality of conductive elements each having a top surface exposed at the front surface and having a bottom surface remote from the top surface, the semiconductor chip having a first opening extending from the rear surface partially through the semiconductor material region towards the front surface, and a second opening meeting the first opening within the semiconductor material region and extending towards the front surface;
a first dielectric layer overlying an interior surface of the first opening;
a second dielectric layer overlying an interior surface of the second opening, at least a portion of the first dielectric layer contacting a surface of the second dielectric layer;
a conductive via in contact with and in registration with the conductive element and extending within the second opening;
a conductive interconnect electrically connected with the conductive via and extending away therefrom at least partly within the first opening; and
a conductive contact electrically connected to the conductive interconnect, the contact available for connection with an element external to the microelectronic unit.

15. A microelectronic unit as claimed in claim 14, wherein the first opening has a first width in a lateral direction along the rear surface, the second opening has a second width in the lateral direction where the second opening meets the first opening, and the second opening has a third width in the lateral direction adjacent the front surface, the first width being greater than the second width, and the second width being greater than the third width.

16. A microelectronic unit as claimed in claim 14, wherein the first opening has a first width in a lateral direction along the rear surface, the second opening has a second width in the lateral direction where the second opening meets the first opening, and the second opening has a third width in the lateral direction adjacent the front surface, each of the first and the third widths being greater than the second width.

17. A microelectronic element as claimed in claim 14, wherein a plurality of the second openings meet the first opening, the microelectronic unit having a plurality of the conductive vias extending from respective ones of the conductive elements, and a plurality of the conductive interconnects extending away therefrom, wherein the first dielectric layer provides insulation between respective ones of at least some of the conductive interconnects.

18. A microelectronic unit as claimed in claim 14, wherein the conductive via includes a conductive coating having a contour conforming to a contour of an interior surface of the second opening.

19. A microelectronic unit as claimed in claim 18, further including a dielectric layer overlying the conductive coating within the second opening.

20. A microelectronic unit as claimed in claim 14, wherein the via is insulated from a surface of the semiconductor material region exposed within the second opening by a dielectric layer, the via including a conductive material filling a volume within the second opening bounded by the dielectric layer.

21. A microelectronic unit as claimed in claim 20, wherein the conductive interconnect includes a conductive feature having a contour conforming to a contour of an interior surface of the first opening.

22. A microelectronic unit as claimed in claim 20, wherein the conductive interconnect is insulated from a surface of the semiconductor material region exposed within the first opening by a dielectric layer, the conductive material of the conductive interconnect filling a volume within the first opening bounded by the dielectric layer.

23. A microelectronic unit as claimed in claim 15, wherein the conductive material of the conductive via overlies the second dielectric layer, the conductive material filling a volume within the second opening remaining after providing the second dielectric layer.

24. A microelectronic unit as claimed in claim 23, wherein the conductive interconnect includes a conductive feature having a contour conforming to a contour of an interior surface of the first opening.

25. A microelectronic unit as claimed in claim 24, wherein the conductive interconnect is insulated from a surface of the semiconductor material region exposed within the first opening by a dielectric layer, the conductive interconnect filling a volume remaining within the first opening after providing the dielectric layer.

* * * * *

UNITED STATES PATENT AND TRADEMARK OFFICE
CERTIFICATE OF CORRECTION

PATENT NO. : 8,310,036 B2  
APPLICATION NO. : 12/784841  
DATED : November 13, 2012  
INVENTOR(S) : Belgacem Haba et al.

Page 1 of 1

It is certified that error appears in the above-identified patent and that said Letters Patent is hereby corrected as shown below:

On the title page, line 66, after "Feb. 26, 2008," delete the words "Substitute for" and insert --which claims the benefit of--.

Signed and Sealed this  
Twenty-third Day of April, 2013

Teresa Stanek Rea  
*Acting Director of the United States Patent and Trademark Office*

UNITED STATES PATENT AND TRADEMARK OFFICE
CERTIFICATE OF CORRECTION

PATENT NO. : 8,310,036 B2
APPLICATION NO. : 12/784841
DATED : November 13, 2012
INVENTOR(S) : Belgacem Haba et al.

Page 1 of 1

It is certified that error appears in the above-identified patent and that said Letters Patent is hereby corrected as shown below:

On the title page, Item (66) Related U.S. Application Data, after "Feb. 26, 2008," delete the words "Substitute for" and insert --which claims the benefit of--.

This certificate supersedes the Certificate of Correction issued April 23, 2013.

Signed and Sealed this
Twenty-first Day of May, 2013

Teresa Stanek Rea
*Acting Director of the United States Patent and Trademark Office*